United States Patent
Jaklic

(10) Patent No.: US 10,627,713 B1
(45) Date of Patent: Apr. 21, 2020

(54) CHECKING MINIMUM WIDTH, MINIMUM DISTANCE AND MAXIMUM CURVATURE OF PLANAR REGION BOUNDARIES DEFINED BY ARBITRARY PARAMETRIC CURVES

(71) Applicant: Cadence Design Systems, Inc., San Jose, CA (US)

(72) Inventor: Janez Jaklic, Feldkirchen (DE)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/165,994

(22) Filed: Oct. 19, 2018

(51) Int. Cl.
*G06F 17/50* (2006.01)
*G03F 1/36* (2012.01)

(52) U.S. Cl.
CPC ............ *G03F 1/36* (2013.01); *G06F 17/5081* (2013.01)

(58) Field of Classification Search
CPC .................................................... G06F 17/5081
USPC ...................................................... 716/51, 52
See application file for complete search history.

(56) References Cited

U.S. PATENT DOCUMENTS

| 7,346,886 | B2 | 3/2008 | Fukagawa et al. |
| 2003/0065494 | A1 | 4/2003 | Croix |
| 2003/0083764 | A1 | 5/2003 | Hong |
| 2006/0230365 | A1 | 10/2006 | Bromberger |
| 2007/0226668 | A1 | 9/2007 | Dasdan et al. |
| 2008/0024499 | A1* | 1/2008 | Bateman ................. G06T 17/30 345/441 |
| 2009/0324093 | A1* | 12/2009 | Miarecki et al. ........ G06K 9/42 382/203 |
| 2011/0022219 | A1 | 1/2011 | Saied et al. |
| 2012/0017193 | A1 | 1/2012 | Ou |
| 2014/0321165 | A1 | 10/2014 | Sanchez et al. |
| 2018/0239860 | A1 | 8/2018 | Allen |

OTHER PUBLICATIONS

Li et al."Global Topological Change of Offset Domains", Jun. 2011, IEEE, 2011 Eigth Internal Symposium on Voronoi Diagrams in Science and Engineering, Technical Digest, pp. 83-90.*

* cited by examiner

*Primary Examiner* — Sun J Lin
(74) *Attorney, Agent, or Firm* — McDermott Will & Emery LLP

(57) ABSTRACT

A method for determining a minimum width, a minimum distance and maximum curvature violations for an integrated circuit (IC) design is provided. The method includes creating a set of offset boundary curves based on inputs received for a given boundary set and a defined minimum width and a defined minimum distance. The method also includes determining all intersections between all pairs of offset boundary curves and assigning a node to each intersection point. The method also includes determining all sections between intersection points for each offset curve and determining successors of the sections. The method also includes determining all violation boundaries formed by the sections and forming a layout to manufacture a mask for fabricating the IC when no violations occur. A system and computer-readable media for performing the method are also provided.

20 Claims, 10 Drawing Sheets

CHECKING MINIMUM WIDTH, MINIMUM DISTANCE AND MAXIMUM CURVATURE OF PLANAR REGION BOUNDARIES DEFINED BY ARBITRARY PARAMETRIC CURVES

TECHNICAL FIELD

Embodiments described herein are generally related to the field of physical layout for integrated circuit (IC) design and fabrication. More specifically, embodiments described herein are related to checking minimum width, minimum distance and maximum curvature for the curved boundaries based on exact representation by mathematical curves in symbolic form for lithographic mask layout.

BACKGROUND

In IC design, minimum width and minimum distance of shapes are the most fundamental design rules in the generation of lithographic masks for IC manufacturing. When applied to polygons, these design rule checks are widely available in a variety of Electronic Design Automation tools for design and verification of IC, IC packages and printed circuit boards. For certain applications, however, the use of more general classes of shapes than polygons is required. For example, the shapes of silicon photonics, MEMS and microfluidics devices may be the result of the mathematical solution of some underlying physical model and therefore most naturally described by curves given by arbitrary parametric functions. For these applications, the existing methods for checking minimum width and minimum distance of polygons are no longer sufficient and need to be extended to more general shapes whose boundaries consist of arbitrary curves. However, checking of minimum width and minimum spacing on polygons that are approximation of curved boundaries can lead to false violations or even miss some violations entirely. In addition, for arbitrary curves the checking of maximum curvature is also required, which is not provided by current tools for checking polygons.

It is desirable to provide a method and a strategy for checking the minimum width and the minimum distance of planar region boundaries defined by arbitrary parametric curves, while also checking the maximum positive (convex) curvature and the minimum negative (concave) curvature, respectively, of the boundary curves.

The description provided in the background section should not be assumed prior art merely because it is mentioned in or associated with the background section. The background section may include information that describes one or more aspects of the subject technology.

SUMMARY

In some embodiments, a computer-implemented method includes providing a plurality of inputs for an identified boundary set and determining a definition of distance for one of minimum width checking and minimum distance checking for an identified boundary set in a design for an integrated circuit. The computer-implemented method also includes creating a set of offset boundary curves and determining all intersections between all pairs of offset boundary curves. The computer-implemented method further includes assigning a node to each intersection point, determining all sections between intersection points for each offset curve and determining successors of the sections. The computer-implemented method also includes determining all violation boundaries formed by the sections and forming a layout to manufacture a mask for fabricating the integrated circuit according to the identified boundary set when there are no violation boundaries formed by the sections.

In some embodiments, a system is disclosed that includes a memory storing instructions and a processor configured to execute the instructions to provide a plurality of inputs for an identified boundary set. The inputs may include a minimum width and a minimum distance. The processor is also configured to execute instructions to cause the system to determine a definition of distance for one of minimum width checking and minimum distance checking and to create a set of offset boundary curves formed from the identified boundary set. The processor is further configured to execute instructions to determine a first intersection point formed between at least one pair of offset boundary curves, transform the first intersection point into a design node, determine a section between the first intersection point and a second intersection point for an offset boundary curve. The processor is also configured to execute instructions to determine a violation boundary formed by the section based on the minimum width and the minimum distance, and to form a layout to manufacture a mask for fabricating the integrated circuit according to the identified boundary set when there are no violation boundaries formed by the section.

In some embodiments, a non-transitory, machine-readable storage medium is disclosed that includes instructions which, when executed by a processor, cause a computer to perform a method including providing a plurality of inputs for an identified boundary set in a design for an integrated circuit, where the inputs include a minimum width and a minimum distance. The method also includes creating a set of offset boundary curves from the identified boundary set, determining a first intersection point formed between at least one pair of offset boundary curves and transforming the first intersection point into a design node. The method further includes determining a section between the first intersection point and a second intersection point for an offset boundary curve, determining a violation boundary formed by the section based on the minimum width and the minimum distance, and forming a layout to manufacture a mask for fabrication the integrated circuit according to the identified boundary set when there are no violation boundaries formed by the section.

BRIEF DESCRIPTION OF THE DRAWINGS

The accompanying drawings, which are included to provide further understanding and are incorporated in and constitute a part of this specification, illustrate disclosed embodiments, and together with the description, serve to explain the principles of the disclosed embodiments. In the drawings.

Figure 1:
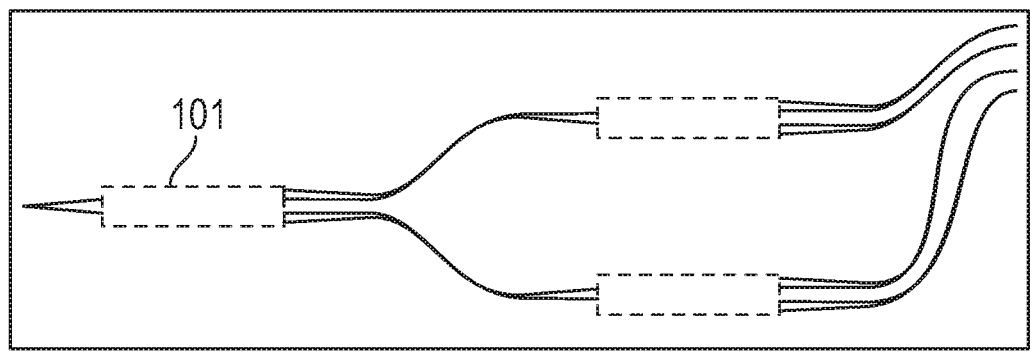
FIG. 1 illustrates a schematic of an IC design, according to some embodiments.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and descriptions are to be regarded as illustrative in nature and not restrictive.

General Overview

The disclosed system provides a method for checking the minimum width and the minimum distance of planar region boundaries defined by arbitrary parametric curves, while at the same time the minimum width check and the minimum distance check are also checking the maximum positive (convex) curvature and the minimum negative (concave) curvature, respectively, of the boundary curves. The method is finding the intersections of the curves based on a method for error-controlled discretization of the curves and symbolic algebra to compute the derivatives of the curve functions.

The disclosed system addresses a technical problem tied to computer technology and arising in the realm of computer networks, namely the technical problem of accurately finding the minimum widths and distances for components in IC design, as well as the heretofore unsolved technical problem of checking maximum curvature of boundary curves. The disclosed system solves these problems by checking minimum width, minimum distance and maximum curvature of curved boundaries based on their exact representation by mathematical curves in symbolic form, instead of approximating the boundaries by polygons and applying existing methods. Embodiments consistent with the present disclosure also provide a method for exact determination of curve sections on the same boundary or different boundaries that violate the minimum width or minimum distance rule. Embodiments consistent with the present disclosure also provide a method for exact determination of curve sections that exceed maximum convex or maximum concave curvature.

Embodiments as disclosed herein greatly enhance the performance of a computer by reducing the computational burden and processing time of performing IC designs. Further, embodiments as disclosed herein enhance the performance of a computer by increasing accuracy and reducing errors of component placement in IC designs.

FIG. 1 illustrates a schematic of an IC design 100 according to some embodiments. IC design 100 may include connected circuit components having a plurality of circuit components 101. In general, components 101 may include complex and problematic components for the IC design 100, such as silicon photonics, MEMS, waveguides and microfluidics devices, for example. Circuit components 101 may also include metal-oxide-semiconductor field effect (MOSFET) transistors, N-type MOS (NMOS) transistors, P-type MOS transistors (PMOS), resistors, capacitors, inductors, and the like. Some of the specifications that may be relevant for IC design 100 may include, without limitation, minimum width and minimum distance of shapes, maximum convex curvature and minimum concave curvature. Accordingly, a user may be interested in modeling IC design 100 according to the highest density of components possible in the least amount of substrate area, while avoiding overlapping of components. For example, IC design 100 shows a physical layout of a photonic circuit and the curved waveguide paths that increase the complexity of IC design.

The subject technology provides analysis of circuit design based on minimum width and minimum distance design rules. For the minimum width, violations of the minimum width $W_{min}$ design rule for the boundaries of planar regions may be found by: offsetting boundary curves by $-W_{min}/2$; finding intersections and self-intersections of the offset boundary curves; finding offset boundary curve sections between the intersection and self-intersection points; finding the minimum width violation boundaries formed by the offset boundary curve sections; and finding the violating original boundary curve sections by offsetting the curve sections of the minimum width violation boundaries by $W_{min}/2$.

Figure 2A:
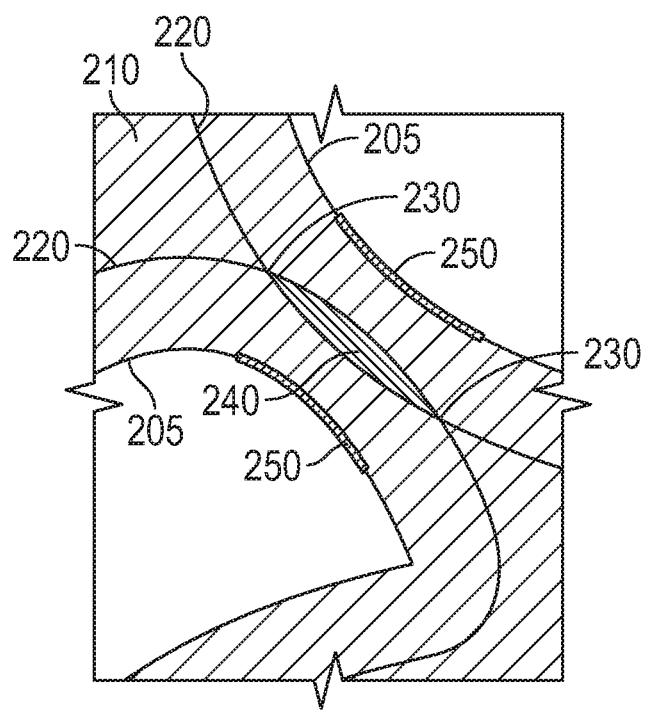
FIGS. 2A and 2B illustrate example minimum width violations.
Figure 2B:
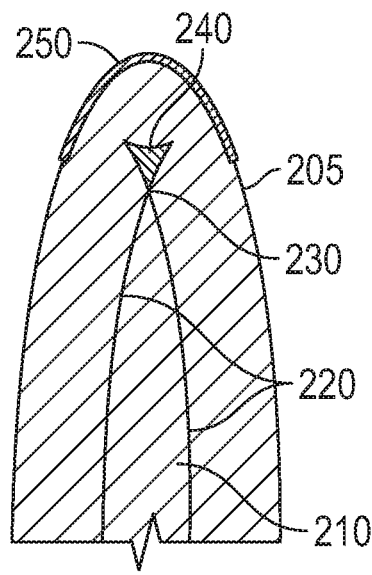

FIGS. 2A and 2B show this process for two different types of minimum width violations. For example, FIG. 2A shows the minimum width violation caused by two different curve sections on the original boundary 210 in distance less than $W_{min}$ from each other. As another example, FIG. 2B shows the maximum convex curvature violation caused by a single curve section on the original boundary 210 for which the curvature κ exceeded the maximum value $κ > 2/W_{min}$. The offset boundary curves 220 are shown as parallel thin lines in distance $W_{min}/2$ inwards from the original boundary curves 205. The intersections of the offset boundary curves 230 define the offset boundary curve sections, which form the minimum width violation boundary 240. Further, the thick lines 250 show the violating original boundary curve sections obtained by offsetting the boundary curve sections forming the minimum width violation boundary by $W_{min}/2$.

For the minimum distance, violations of the minimum distance $D_{min}$ design rule for the boundaries of planar regions may be found by: offsetting boundary curves by $D_{min}/2$; finding intersections and self-intersections of the offset boundary curves; finding offset boundary curve sections between the intersection and self-intersection points; finding the minimum distance violation boundaries formed by the offset boundary curve sections; and finding the violating original boundary curve sections by offsetting the curve sections of the minimum distance violation boundaries by $-D_{min}/2$.

Figure 3A:
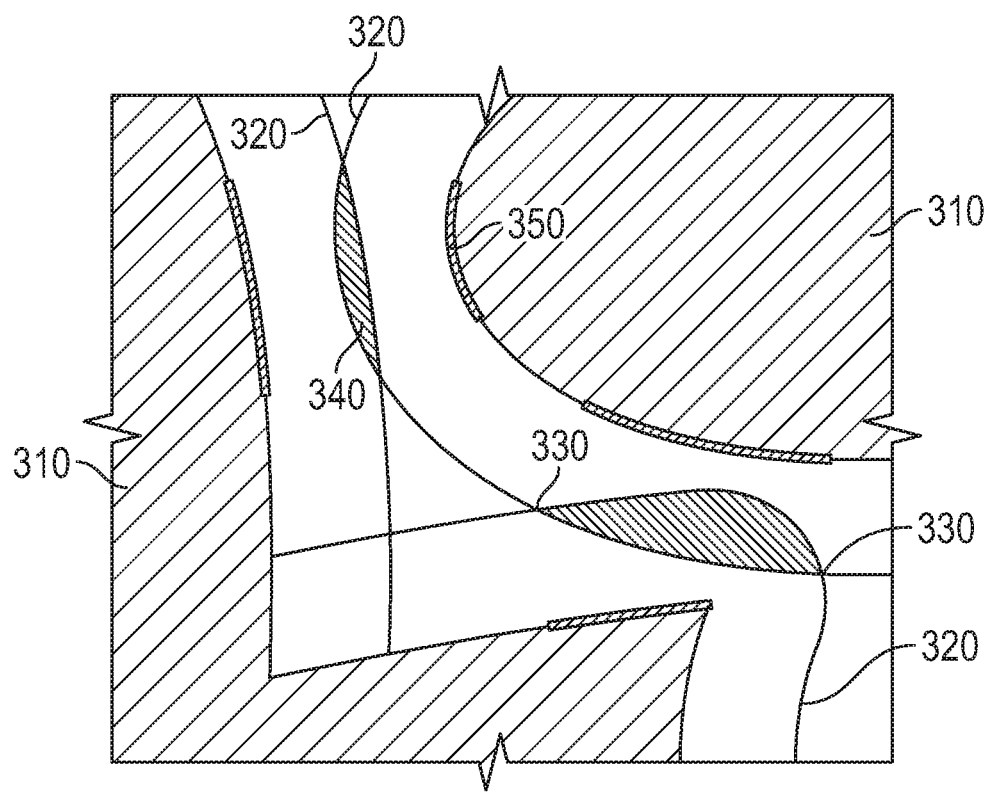
FIGS. 3A-3C illustrate example minimum distance violations.
Figure 3B:
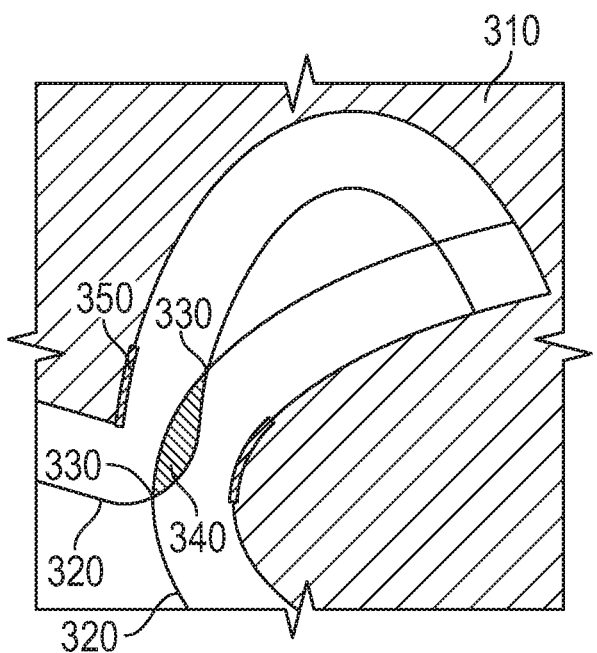
Figure 3C:
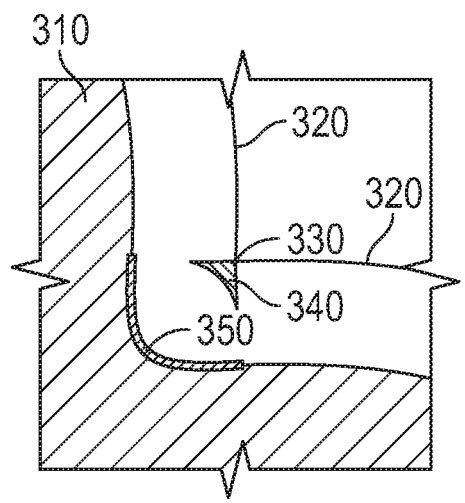

FIGS. 3A-3C show this process for three different types of minimum distance violations. For example, FIG. 3A shows the minimum distance violation caused by curve sections on two different original boundaries 310 in distance less than $D_{min}$ from each other. As another example, FIG. 3B shows the minimum self-distance violation caused by two different curve sections on the same original boundary 310 in distance less than $D_{min}$ from each other. As yet another example, FIG. 3C shows the maximum concave curvature violation caused by a single curve section on the original boundary for which the negative curvature exceeded the maximum value $-\kappa > 2/D_{min}$.

The offset boundary curves 320 are shown as parallel thin lines in distance $D_{min}/2$ outwards from the original boundary curves. The intersections 330 of the offset boundary curves define the offset boundary curve sections, which form the minimum distance violation boundary 340. Further, the thick lines 350 show the violating original boundary curve sections obtained by offsetting the boundary curve sections forming the minimum distance violation boundary by $-D_{min}/2$.

In the subject disclosure, curves may be defined in parametric form $$c = \{r(t) = (x(t), y(t)), t_1 \leq t \leq t_2\}, \quad (1)$$

where r is a point on the curve in the plane with coordinates (x, y) and parameter t takes values on the interval [$t_1$, $t_2$]. Each curve has an associated orientation o(c) with two possible values ±1 determining the parameter $t_F$(c) of the first point $r(t_F(c))$ on the curve and the parameter $t_L$(c) of the last point $r(t_L(c))$ on the curve $$t_F(c) = \frac{t_1 + t_2}{2} + o(c)\frac{t_1 - t_2}{2}$$

$$t_L(c) = \frac{t_1 + t_2}{2} - o(c)\frac{t_1 - t_2}{2}.$$

Here and in the following, it is assumed that the curve functions in (1) are analytical and thus infinitely differentiable. The curve tangent vector is defined by $$T(r(t)) = \frac{o(c)}{\sqrt{x'(t)^2 + y'(t)^2}} (x'(t), y'(t)), \quad (2)$$

so that it changes the orientation when the orientation of the curve changes. The signed curvature of the curve (1) is given by $$\kappa(r(t)) = o(c) \frac{x'(t)y''(t) - y'(t)x''(t)}{\sqrt{(x'(t)^2 + y'(t)^2)^3}}. \quad (3)$$

The curvature is positive (negative) if the tangent vector is rotating counter-clockwise (clockwise) when the point on the curve is moving from the first to the last point of the curve.

The boundary B(R) enclosing the region R is defined as a list of N oriented curves $$B(R) = \{c_1, \ldots, c_i, \ldots, c_N\}$$

$$c_i = \{e_i(t) = (x_i(t), y_i(t)), t \in [t_{i1}, t_{i2}]\} \quad (4)$$

connected together such that the last point of each curve coincides with the first point of the next curve and that the last point of the last curve coincides with the first point of the first curve $$r^i(t_L(c_i)) = r_{i+1}(t_F(c_{i+1})) \; i = 1, \ldots, N-1$$

$$r_N(t_L(c_N)) = r_1(t_F(c_1)).$$

The subject technology allows for the case N=1 where the boundary consists of a single curve forming a loop. The curves are assumed not to intersect with other curves and also not with itself, except at the first and the last point where each curve is connected to the next curve in the list, or to itself in case N=1. Thus the region R enclosed by the boundary B(R) is always simply connected. The area A(B(R)) of the region R enclosed by the boundary B(R) is defined by $$A(B(R)) = \frac{1}{2} \sum_{i=1}^{N} \int_{t_{i,1}}^{t_{i,2}} \left( x_i(t) \frac{dy_i(t)}{dt} - y_i(t) \frac{dx_i(t)}{dt} \right) dt. \quad (5)$$

The region R enclosed by the boundary B(R) is defined differently depending on the value of A(B(R)). If the area A(B(R)) is positive, the boundary B(R) is oriented counter-clockwise and the region R is defined to lie on the left side of the tangent vector T ($r_i$(t)) on each curve. Otherwise, if the area A(B(R)) is negative, the boundary B(R) is oriented clockwise and the region R is defined to lie on the right side of the tangent vector T ($r_i$(t)) on each curve. The regions with negative area are called holes.

Region set R is defined as a set of disjoint regions without any common points $$\mathcal{R} = \{R_i\}, \; i \neq j \Leftrightarrow R_i \cap R_j = \emptyset \quad (6)$$

Boundary set B(R) is defined as a set of boundaries of the regions from the region set R $$\mathcal{B}(\mathcal{R}) = \{B(R_i), R_i \in \mathcal{R}\}. \quad (7)$$

Since the regions in R are disjoint, the boundaries inside the boundary set B(R) are also disjoint.

Vertex points $c_{ij}$ is defined as those points where two different curves $c_i$ and $c_j$ belonging to the same boundary coincide $$c_{ij} = r_i(t_{i2}) = r_j(t_{j1}), \quad (8)$$

where either j=i+1 or i=N and j=1. The vertex angle is defined by $$\Delta\phi_{ij} = \mathcal{P} \angle (T(r_i(t_{i2})), T(r(t_{j1}))), \quad (9)$$

where P denotes the principal value of the angle such that $-\pi < \Delta\phi_{ij} \leq \pi$. The vertex is convex if $\Delta\phi_{ij} > 0$ and concave if $\Delta\phi_{ij} < 0$.

The offset curve $\bar{c}$ of the curve (1) is defined as its parallel curve obtained by translating each curve point by the offset distance D in the direction of the normal vector to the curve, which is equal to the tangent vector of the curve rotated by $-\pi/2$, $$\overline{c} = \{\overline{r}(t) = (\overline{x}(t), \overline{y}(t)), t_1 \leq t \leq t_2\}$$

$$\overline{x}(t) = x(t) + D\frac{y'(t)}{\sqrt{x'(t)^2 + y'(t)^2}} \quad (10)$$

$$\overline{y}(t) = y(t) - D\frac{x'(t)}{\sqrt{x'(t)^2 + y'(t)^2}}. \quad (11)$$

The orientation of the offset curve is defined to be the same as the orientation of the original curve $o(c) = o(\overline{c})$.

The offset distance D can be either positive or negative. For the purpose of minimum width and minimum distance checking, the offset distance is chosen as follows:

$D = -W_{min}/2$ for checking the minimum width $W_{min}$ $D = D_{min}/2$ for checking the minimum distance $D_{min}$.

Figure 4:
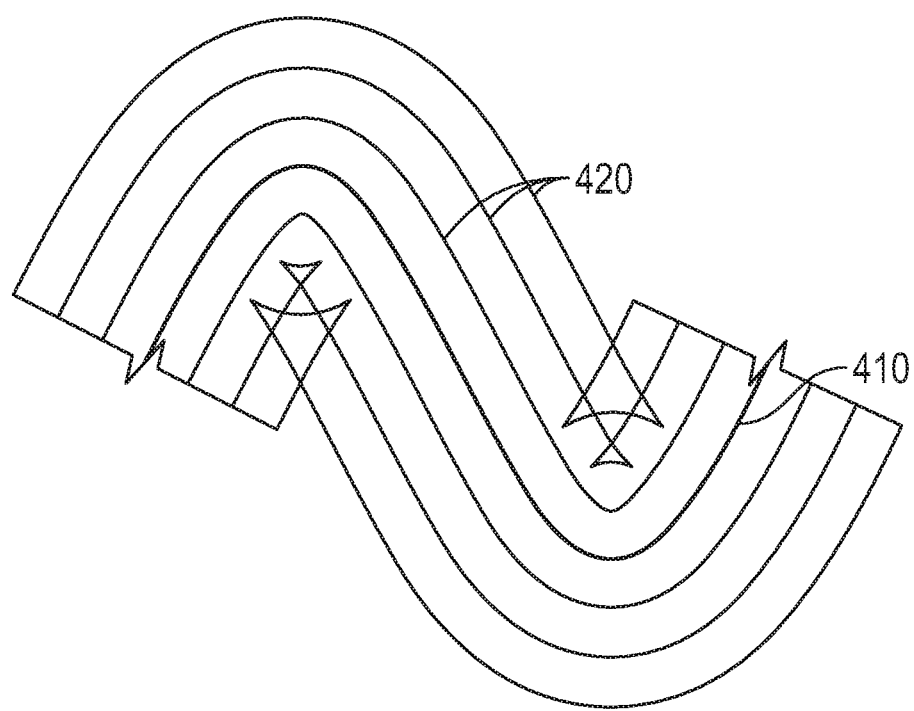
FIG. 4 illustrates a sine curve and the offset curves obtained from it for different positive and two negative values of the offset distance, according to some embodiments.

FIG. 4 shows one period of a sine curve 410 and the offset curves 420 obtained from it for different positive and two negative values of the offset distance. The tangent vector of the offset curve T ($\overline{r}(t)$) is always parallel to the tangent vector T ($r(t)$). Its direction depends on the sign of the curvature of the offset curve which is given by $$\overline{\kappa}(t) = \frac{\kappa(t)}{1 + D\kappa(t)}. \quad (12)$$

The tangent vectors have the same direction when $\kappa(t) < -1/D$, i.e. when $\kappa(t)$ and $\overline{\kappa}(t)$ have the same sign, and opposite direction when $\kappa(t) > -1/D$, i.e. when $\kappa(t)$ and $\overline{\kappa}(t)$ have opposite signs. At points where $\kappa(t) = -1/D$, the tangent vector changes the direction discontinuously and the offset curves exhibit cusps. At each pair of cusp points, the tangent vector on the curve section between the cusp points has the opposite direction than the tangent vectors of the two curve sections before and after the cusp point. The two curve sections before and after the cusp points may therefore intersect, thus resulting in the intersections of the offset curve with itself.

The offset curve can also be defined for vertex points in two cases:

for convex vertex points with $\Delta\varphi_{ij} > 0$, when $D > 0$;
and for concave vertex points with $\Delta\varphi_{ij} < 0$, when $D < 0$.

The offset vertex point of the vertex point $c_{ij}$ with coordinates $x_{ij} = x_i(t_{i2}) = x_j(t_{j1})$ and $y_{ij} = y_i(t_{i2}) = y_j(t_{j1})$ is defined as a circular arc $\overline{c}_{i,j}$ with the orientation and the angle such that it connects the last point $\overline{c}_i(t_{i2})$ of the offset curve of $c_i$ with the first point $\overline{c}_j(t_{j1})$ of the offset curve of $c_j$:

$$\overline{c}_{ij} = \{(x_{ij} + D\cos(t), y_{ij} + D\sin(t)), \quad (13)$$

$$\min(\phi_i, \phi_i + |\Delta\phi_{ij}|) \leq t \leq \max(\phi_i, \phi_i + \Delta\phi_{ij}|)\}$$

$$\phi_i = \angle(x, T(r_i(t_{i2})) - \pi/2$$

$$\Delta\phi_{ij} = \angle(T(r_i(t_{i2})), T(r_j(t_{j1})))$$

$$o(\overline{c}_{ij}) = D/|D|.$$

The set of offset boundary curves $\overline{B}'(R)$ of the boundary B(R), Eq. (4) are defined as a list of curves derived by offsetting each curve and each vertex point of the boundary B(R)

$$\overline{B}'(r) = \{\overline{c}_1, \overline{c}_{12}, \ldots, \overline{c}_{i-1,i}, \overline{c}_i, \overline{c}_{i,i+1}, \ldots, \overline{c}_N\}. \quad (14)$$

The offset boundary curve set $\overline{B}'$ of the boundary set $B = \{B(R)\}$ is defined as the union of all offset boundary curves of all boundaries contained in the elements of B $$\overline{B}' = \bigcup_{B(R) \in B} \overline{B}'(R). \quad (15)$$

Figure 5:
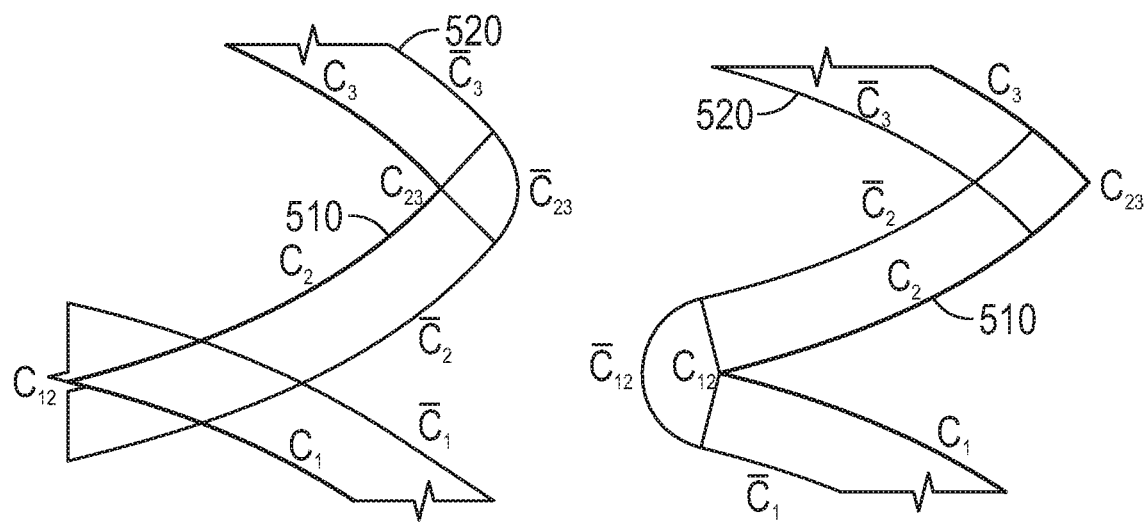
FIG. 5 illustrates offset boundary curves for a positive and a negative value of offset distance, according to some embodiments.

FIG. 5 shows the offset boundary curves for a positive and a negative value of offset distance D. The original boundary 510 is composed of elliptic arcs $c_1$, $c_2$, $c_3$, concave vertex point $c_{12}$ and convex vertex point $c_{23}$. The set of offset boundary curves 520 consists of the offset curves $\overline{c}_1$, $\overline{c}_2$, $\overline{c}_3$ and the offset curve $\overline{c}_{23}$ in case D>0, and the offset curve $\overline{c}_{12}$ in case D<0, respectively.

As seen in FIGS. 4 and 5, the offset boundary curves 420, 520 can intersect each other or even itself. Here, the term $\tau_i$ denotes the parameter values on the offset curve $\overline{c}$ corresponding to the points where the offset curve 420, 520 intersects with itself or with other offset curves 420, 520 or to the vertices where the end point of the offset curve 420, 520 coincides with end point of another offset curve. If the list of $\tau_i$ is sorted in ascending order and $\tau < \tau'$ are two consecutive parameter values in the sorted list, then the section $\overline{c}(\tau, \tau')$ of the offset boundary curve $\overline{c}$ is defined as $$\overline{c}(\tau, \tau') = \{\overline{r}(t) = (\overline{x}(t), \overline{y}(t)), t_1 \leq \tau \leq t \leq \tau' \leq t_2\}. \quad (16)$$

The first and the last point of the offset curve section are defined to be $\overline{r}(\tau)$ and $\overline{r}(\tau')$, respectively, if $o(c) = +1$, or vice versa if $o(c) = -1$.

Figure 6:
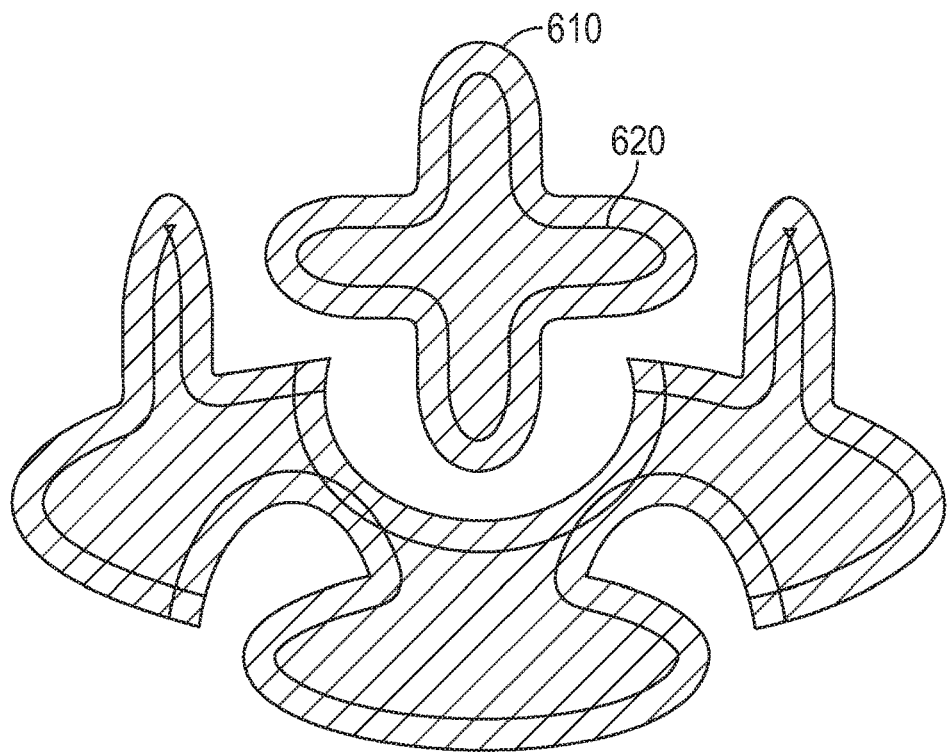
FIG. 6 illustrates offset boundary curves for minimum width checking, according to some embodiments.
Figure 7:
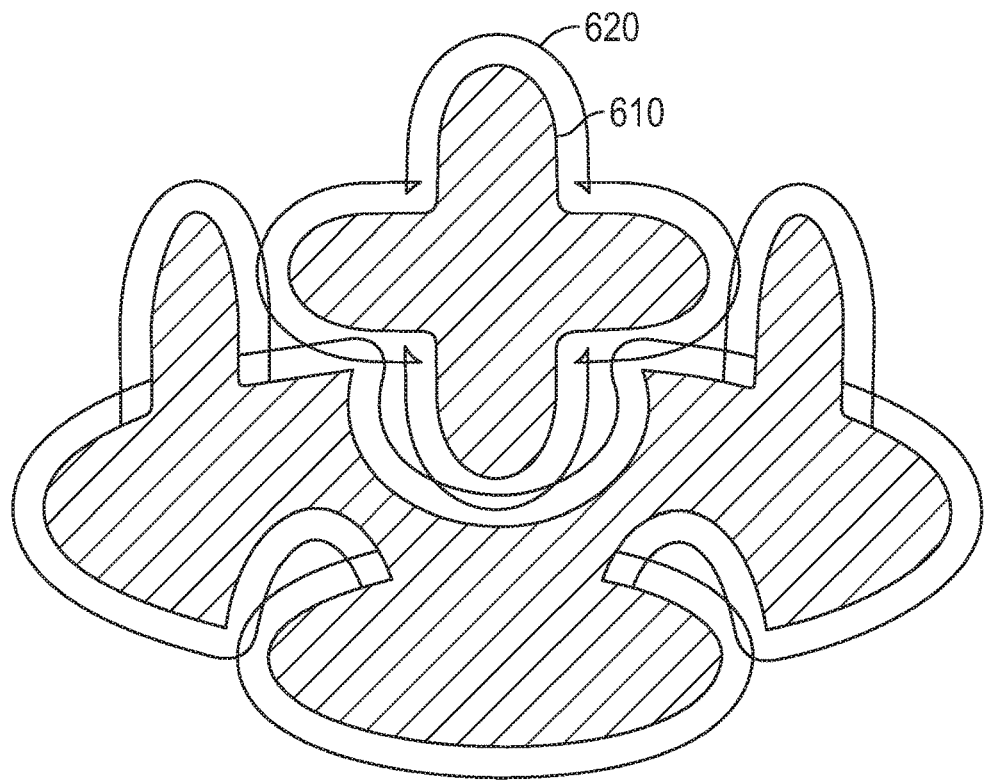
FIG. 7 illustrates offset boundary curves for minimum distance checking, according to some embodiments.

FIGS. 6 and 7 show the original boundaries 610, 710 and the offset boundary curve sections 620, 720 for minimum width checking with negative $D = -W_{min}/2$ and for minimum distance checking with positive $D = D_{min}/2$.

A node is defined as a set of all end points of offset curve sections within minimum node distance $\mu$. More precisely, each intersection point r is assigned a node n(r) such that $$|r_1 - r_2| \leq \|\Leftrightarrow n(r_1) = n(r_2). \quad (17)$$

This means that even if the distance between two intersection points $r_1$ and $r_m$ is larger than $\mu$, they can still belong to the same node by transitivity if there are other intersection points $r_i$ such that $$|r_i - r_{i+1}| < \mu, i = 1, \ldots, m-1. \quad (18)$$

A pair of offset boundary curve sections $\overline{c}_k(\tau_1, \tau_2)$ and $\overline{c}_l(\tau'_1, \tau'_2)$ are defined to be connected at node n if both the last point $\overline{r}(t_L(\overline{c}_k(\tau_1, \tau_2)))$ of the first section and the first point $\overline{r}(t_F(\overline{c}_l(\tau_1, \tau 2))$ of the second section belong to node n $$n(\overline{r}_k(t_L(\overline{c}_k(\tau_1, \tau_2))) = n(\overline{r}_l t_L(\overline{c}_k(\tau_1', \tau_2')) = n. \quad (19)$$

An offset boundary curve section can be connected to itself if it forms a loop such that its first and its last point belong to the same node.

Offset boundary curve section $\overline{c}_l(\tau'_1, \tau'_2)$ is defined to be tangential to $\overline{c}_k(\tau_1, \tau_2))$ at node n if either the first points of both offset boundary curve sections belong to node n $$n(\overline{r}_k(t_F(\overline{c}_k(\tau_1, \tau_2)))) = n(\overline{r}_l(t_L(\overline{c}_k(\tau_1', \tau_2')))) = n. \quad (20)$$

or the last points of both offset boundary curve sections belong to node n $$n(\bar{r}_k(t_L(\bar{c}_k(\tau_1,\tau_2))))=n(\bar{r}_j(t_L(\bar{c}_k(\tau_1',\tau_2'))))=n. \quad (21)$$

and the tangents of both offset boundary curve sections at the end points belonging to node n have the same direction $$\angle(T(\bar{r}_k(t_L(\bar{c}_k(\tau_1,\tau_2))))=T(\bar{r}_j(t_F(\bar{c}_k(\tau_1',\tau_2')))))=0. \quad (22)$$

Curve section $\bar{c}_l(\tau'_1, \tau'_2)$ is defined to be a successor of curve section $\bar{c}_k(\tau_1, \tau_2)$ $$\bar{c}_i(\tau_1',\tau_2')=\sigma(\bar{c}_k(\tau_1,\tau_2))) \quad (23)$$

for checking the minimum width $W_{min}$ or the minimum distance $D_{min}$ with respect to the sign parameter S $$S = \begin{cases} +1, & \text{when checking minimum width } W_{min} \\ -1, & \text{when checking minimum distance } D_{min} \end{cases} \quad (24)$$

If:
$\bar{c}l(\tau'1, \tau'2)$ and $\bar{c}k(\tau 1, \tau 2))$ are connected at node n;
if there are other curve sections tangential to $\bar{c}k(\tau 1, \tau 2)$, then among them the signed curvature $S_\kappa(\bar{r}k(tL(\bar{c}k(\tau 1, \tau 2))))$ takes the minimum value;
if there are other curve sections tangential to $\bar{c}k(\tau'1, \tau'2)$ at node n, among them the signed curvature $S_\kappa(\bar{r}l(tL(\bar{c}1,\tau'2))))$ takes the minimum value; and
the signed angle between the curve tangents at node n $$S\angle(T(\bar{r}_k(t_L(\bar{c}_k(\tau_1,\tau_2)))),T(\bar{r}_l(t_F(\bar{c}_i(\tau_1',\tau_2'))))) \quad (25)$$

takes the minimum value among all pairs of connected curve sections at node n.

Here, it is possible for a curve section to be its own successor.

Figure 8:
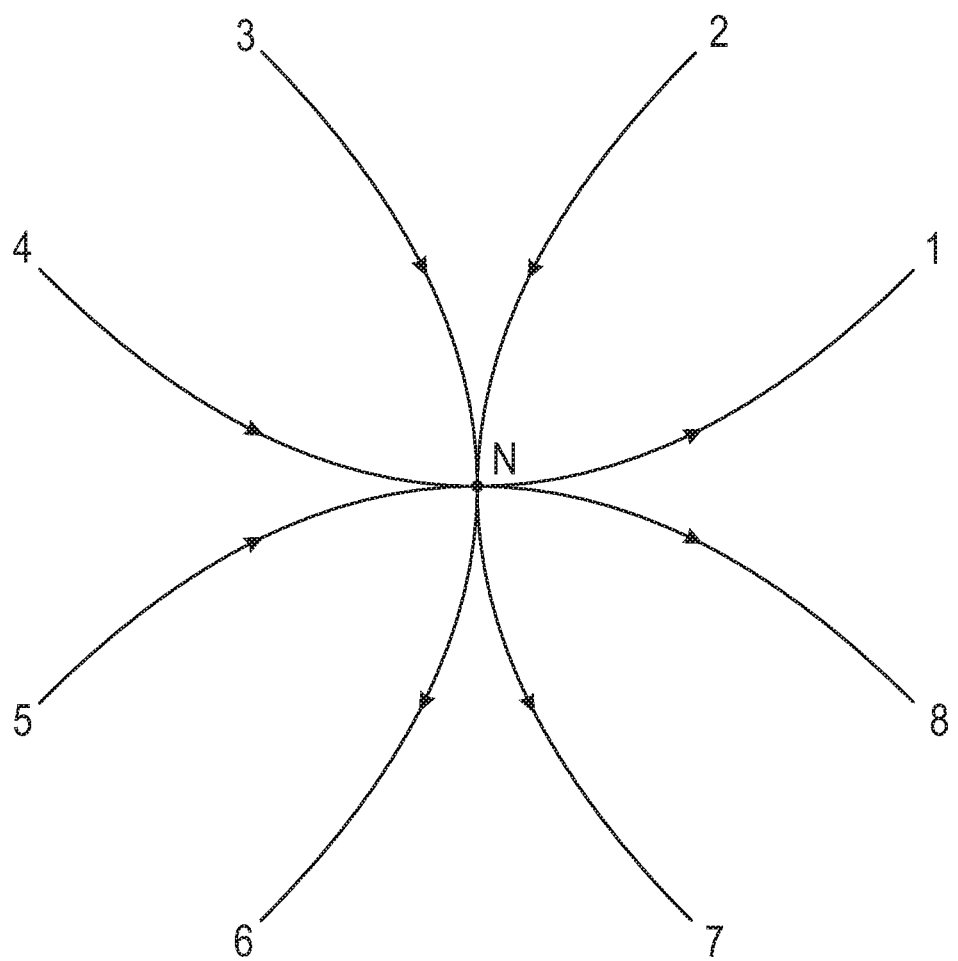
FIG. 8 illustrates the finding of successors on multiple curve sections, according to some embodiments.

FIG. 8 shows the finding of the successors on an example of 8 curve sections enumerated from 1 to 8 that all share the same node N at one of their endpoints. The arrows indicate the curve directions from the first to the last point on each curve section. The pairs of curve sections (2,3), (4,5), (6,7) and (8,1) are pairwise tangential. For S=1, the curvature at the node N is minimum for curve sections 3, 5, 6 and 8. Of these, four pairs (3,6), (3,8), (5,6), (5,8) are connected. Among these, the pair (5,6) has the minimum angle between the curve tangents at node N. Therefore, 6 is the successor of 5, 6=6(5). For S=1, the curvature at the node N is maximum for curve sections 2, 4, 7 and 1. Of these, four pairs (2,7), (2,1), (4,7), (4,1) are connected. Among these, the pair (2,1) has the minimum angle between the curve tangents at node N. Therefore, 1 is the successor of 2, 1=σ(2).

Minimum width and minimum distance violations are indicated by violation boundaries formed by offset boundary curve sections and by violation curve sections on the original boundaries. Violation boundary $\bar{b}$ is defined as a list of sections of curves from the offset boundary curve set $\bar{B}'$ forming a boundary $$\bar{b} = \{\bar{c}_1(\tau_1, \tau_1'), \ldots, \bar{c}_i(\tau_i, \tau_i'), \ldots, \bar{c}_N(\tau_N, \tau_N')\} \quad (26)$$

$$\bar{r}_i(t_L(\bar{c}_i)) = \bar{r}_{i+1}(t_F(\bar{c}_{i+1})) \; i = 1, \ldots, N-1$$

$$\bar{r}_N(t_L(\bar{c}_N)) = \bar{r}_1(t_F(\bar{c}_1))$$

with the additional condition that in the list order each offset boundary curve section is followed by its successor $$\bar{r}_{i+1}(t_F(\bar{c}_{i+1}))=\sigma(\bar{r}_i(t_L(\bar{c}_i))) \; i=1,\ldots,N-1$$

$$\bar{r}_1(t_F(\bar{c}_1))=\sigma(\bar{r}_N(t_L(\bar{c}_N)))$$

Here the successor relationship depends on the sign S having a different value for the minimum width checking and for the minimum distance checking. Each violation boundary $\bar{b}$ encloses a simply connected planar region which we denote by $\bar{R}$, i.e. $\bar{b}=B(\bar{R})$. In general, the set of all violation boundaries $\bar{b}=B(\bar{R})$ is also a boundary set, which is referred to as a violation boundary set and denoted by $\bar{B}$ $$\bar{\bar{B}} =\{B(\bar{R})\}. \quad (27)$$

The area of each violation boundary can be positive or negative. For the purpose of minimum width and minimum distance checking, only violation boundaries $\bar{b}$ with the following signs of the area $A(\bar{b})$ are retained:
$A(\bar{b})<0$, when checking minimum width Wmin
$A(\bar{b})>0$, when checking minimum distance Dmin Each cusp section is by itself also an offset boundary. Such cusp offset boundaries are retained as an indicator of the sections of the original curves where curvature $\kappa>2/W_{min}$ or $\kappa>-2/D_{min}$.

Violation curve sections $\tilde{c}_i(\tau_i, t'_i)$ are obtained by offsetting the sections of the curves $\bar{c}_i(\tau, \tau'_i)$ comprising retained violation boundaries by $-D$, where $-D=W_{min}/2$ for the minimum width checking and $-D=-D_{min}/2$ for the minimum distance checking:

$$\tilde{c}_i = \{\tilde{r}_i(t) = (\tilde{x}_i(t), \tilde{y}_i(t)), \tau_i \le t \le \tau_i'\}$$

$$\tilde{x}_i(t) = \bar{x}_i(t) - D\frac{\bar{y}_i'(t)}{\sqrt{\bar{x}_i'(t)^2 + \bar{y}_i'(t)^2}} \quad (28)$$

$$\tilde{y}_i(t) = \bar{y}_i(t) + D\frac{\bar{x}_i'(t)}{\sqrt{\bar{x}_i'(t)^2 + \bar{y}_i'(t)^2}} \quad (29)$$

Since the curve functions $\bar{x}_i(t)$ and $\bar{y}_i(t)$ have been obtained by offsetting $x_i(t)$ and $y_i(t)$ by D, offsetting $\bar{x}_i(t)$ and $\bar{y}_i(t)$ by $-D$ yields back the original curve functions $$(\tilde{x}_i(t),\tilde{y}_i(t))=(x_i(t),y_i(t)). \quad (30)$$

Therefore the violation curve sections $\tilde{c}_i(\tau_i, \tau'_i)$ are simply obtained as $$\tilde{c}_i=\{r_i(t)=(x_i(t),y_i(t)), \tau_i \le t \le \tau_i'\}.$$

The following illustrates detailed examples of the subject technology. Here, the inputs may be provided as:
$C_{min}=-W_{min}<0$ when checking minimum width
$C_{min}=D_{min}>0$ when checking minimum distance
the number M of boundaries in the input boundary set $\{b_m\}$
array $N[1,\ldots,M]$ of the numbers of curves $M[m]$ in each boundary $b_m$ from the input boundary set
arrays $x[m=M][1,\ldots,N[in]]$ and $y[m=1,\ldots,M][1,\ldots,N[m]]$ of symbolic expressions representing curve functions
arrays $t_1[m=1,\ldots,M][1,\ldots,N[m]]$ and $t_2[m=M][1,\ldots,N[m]]$ of parameter interval bounds
array $o[m=1,\ldots,M][1,\ldots,N[m]]$ of curve orientations with the possible values $\pm 1$
function CURVE-INTERSECTIONS($x, y, t_1, t_2, N, \eta, \lambda$) to return the list of all intersections between the curves, where the arguments are
arrays of symbolic expressions x, y representing curve functions arrays of parameter interval bounds $t_2$, $t_2$
the total number of curves N
initial discretization tolerance ∈
reduction factor for the discretization tolerance η
precision λ by which the intersection points are determined where the result is a list of intersections with components intersection.curve1, intersection.curve2 representing the array indices of the two intersecting curves, object.t1 and object.t2 representing the corresponding parameter values on the two curves at the intersection, and object.point representing the intersection point.

Function to obtain the numerical value of the symbolic expression e for parameter value t is EVALUATE(e,t) and to get the symbolic expression representing the derivative of the symbolic expression e is DERIVE(e).

Minimum distance μ between the intersection points in the same node.

Based on the provided inputs, symbolic expression evaluation and derivation may be determined. Here, the parametric functions describing the curves are given symbolically in form of an expression tree. In such a tree, which may be created by parsing the string representation of the function, each expression node object node represents an expression with, but not limited to, the following information:

Expression type node.type, which may be one of: NUMBER, PARAMETER, SUM, DIFFERENCE, PRODUCT, QUOTIENT, MINUS, POWER, SQRT, LOG, EXP, SIN, COS, TAN, ARCTAN For expression type number, the numerical value node.number.

For expression type power, the integer power node.power.

For unary expression types, the first argument node.first, which is a pointer to another expression node object representing the first argument subexpression.

For binary expression types, the second argument node.second, which is a pointer to another expression node object representing the second argument subexpression.

Further, availability of the functions may create the following:

expression node of type NUMBER, node←NUMBER (value)
expression node of type PARAMETER, node←PARAMETER
expression node of type POWER, node←POWER (power)
expression nodes of unary type
   node←MINUS(first)
   node←LOG(first)
   node←EXP(first)
   node←SIN(first)
   node←COS(first)
   node←TAN(first)
   node←ARCTAN(first)
   node←MINUS(first)
expression node of binary type
   node←SUM(first, second)
   node←DIFFERENCE(first, second)
   node←PRODUCT(first, second)
   node←QUOTIENT(first, second)
   node←POWER(first, second)

Then, for example, the expression tree for the function $$\frac{1}{5\sqrt{8\arctan(1)}} e^{-\frac{1}{2}\left(\frac{t-2}{5}\right)^2} \tag{36}$$

with the string representation 1/(5*sqrt(8*arctan(1)))*exp(-½*((t−2)/5)^2) may be created by the following code sequence:

one←NUMBER(1)
   two←NUMBER(2)
   five←NUMBER(5)
   eight←NUMBER(8)
   t←PARAMETER
   n1←DIFFERENCE(t, two)
   n2←QUOTIENT(n1, five)
   n3←POWER(n2, 2)
   n4←QUOTIENT(one, two)
   n5←MINUS(n4)
   n6←PRODUCT(n5, n3)
   n7←EXP(n6)
   n8←ARCTAN(one)
   n9←PRODUCT(eight, n8)
   n10←SQRT(n9)
   n11←PRODUCT(five, n10)
   n12←QUOTIENT(one, n11)
   f←PRODUCT(n12n7).

The subject technology may use the following function to evaluate the expression given by the top-most node e of the expression tree for the parameter value t:

function EVALUATE(e, t)
     if e.type=NUMBER then
       return e.number
     else if e.type=PARAMETER then
       return t
     else if e.type=SUM then
       return EVALUATE(e.first, t)+EVALUATE(e.second, t)
     else if e.type=DIFFERENCE then
       return EVALUATE(e.first, t)−EVALUATE(e.second, t)
     else if e.type=PRODUCT then
       return EVALUATE(e.first, t)×EVALUATE(e.second, t)
     else if e.type=QUOTIENT then
       return EVALUATE(e.first, t)/EVALUATE(e.second, t)
     else if e.type=MINUS then
       return EVALUATE(e.first)
     else if e.type=POWER then
       r←1
       v←EVALUATE(e.first)
       for i←1, e.power do
          r←rv
       end for
       return r
     else if e.type=SQRT then
       return √EVALUATE(e.first)
     else if e.type=log then
       return log(EVALUATE(e.first))
     else if e.type=EXP then
       return exp(EVALUATE(e.first))
     else if e.type=SIN then
       return sin(EVALUATE(e.first))
     else if e.type=COS then
       return cos(EVALUATE(e.first))
     else if e.type=TAN then
       return tan(EVALUATE(e.first))
     else if e.type=ARCTAN then
       return arctan(EVALUATE(e.first))
     end if
   end function.

The subject technology may use the following function to determine the expression given by the top-most node e of the expression tree and return and return a new expression tree representing the derivative expression:

```
function DERIVE(e)
if e.type=NUMBER then
    return NUMBER(0)
else if e.type=PARAMETER then
    return NUMBER(1)
else if e.type=SUM then
    return SUM(DERIVE(e.first, t) DERIVE(e.second))
else if e.type=DIFFERENCE then
    return DIFFERENCE (DERIVE(e.first, t) DERIVE(e.second))
else if e.type=PRODUCT then
    e1←PRODUCT(DERIVE(e.first), e.second)
    e2←PRODUCT(e.first, DERIVE(e.second))
    return SUM(e1, e2)
else if e.type=QUOTIENT then
    e1←PRODUCT(DERIVE(e.first), e.second)
    e2←PRODUCT(e.first, DERIVE(e.second))
    e3←DIFFERENCE(e1, e2)
    return QUOTIENT(e.3, POWER(e.second, 2))
else if e.type=MINUS then
    return MINUS(DERIVE(e.first))
else if e.type=POWER then
    e1←POWER(e.first, NUMBER(e.power 1))
    e2←PRODUCT(NUMBER(e.power), e1)
    return PRODUCT(DERIVE(e.first), e2)
else if e.type=SQRT then
    e1←QUOTIENT(DERIVE(e.first), SQRT(e.first)) return QUO-
        TIENT (e1, NUMBER(2))
else if e.type=LOG then
    return QUOTIENT(DERIVE(e.first), e.first))
else if e.type=EXP then
    return PRODUCT(DERIVE(e.first), EXP(e.first))
else if e.type=SIN then
    return PRODUCT(DERIVE(e.first), COS(e.first))
else if e.type=COS then
    return MINUS(PRODUCT(DERIVE(e.first), SIN(e.first)))
else if e.type=TAN then
    return QUOTIENT(DERIVE(e.first), POWER(COS(e.first), 2))
else if e.type=ARCTAN then
    return QUOTIENT(DERIVE(e.first), SUM(NUMBER(1), POWER(e-
        .first), 2)))
end if
end function.
```

Section endpoint parameter values may be determined by the subject technology. Here, the following two functions may return the parameter value for the first and the last point of the curve section $c_k(\tau_1, \tau_2)$, respectively, depending on its orientation. The argument section is assumed to be an object with components section.t1, section.t2 and section.o containing the parameter values $\tau_1$, $\tau_2$ and the curve orientation o(c):

```
function FIRST(section)
if section.o>0 then
    return section.t1
else
    return section.t2
end if
end function
function LAST(section)
if section.o>0 then
    return section.t2
else
    return section.t1
end if
end function.
```

The subject technology may determine tangent vectors. The following function calculates the tangent vector of the curve section at parameter value t with the orientation depending on the curve orientation. The argument section is assumed to be an object with components section.x, section.y containing the symbolic expressions to calculate the points and the derivatives of the curve and section.o containing the orientation of the curve section:

```
function TANGENT(section, t)
t.x←section.o×EVALUATE(section.x[1], t)
t.y←section.o×EVALUATE (section.y[1], t)
n←√(tangent.x² + tangent.y²)
t.x←t.x/n
t.x<L.y/n
return t
end function
```

A calculation of curvature may be performed by the subject technology. The following function calculates the signed curvature of the curve section at parameter value t depending on the curve orientation. The argument section is assumed to be an object with components section.x, section.y containing the symbolic expressions to calculate the points and the derivatives of the curve and section.o containing the orientation of the curve section:

```
function CURVATURE(section, t)
x'←section.o×EVALUATE(section.x[1], t)
y'←section.o×EVALUATE(section.y[1], t)
x"←section.o×EVALUATE(section.x[2], t)
y"←section.o×EVALUATE(section.y[2], t)
return←section.o×((x'y"−y'x")/((x')²+(y')²)^(3/2)
end function.
```

The subject technology may determine an angle and a principal angle between vectors. The following two functions return the angle $0 \leq \alpha < 2\pi$ and the principal value of the angle $-\pi < P\alpha \leq \pi$ between the vectors v1 and v2 given as objects with components v1.x, v1.y, v2.x, v2.y containing their coordinates:

```
function PRINCIPAL-ANGLE(v1, v2)
n₁←v1.x×v1.x+v1.y×v1.y
n₂←v2.x×v2.x+v2.y×v2.y
c←(v1.x×v2.x+v1.y×v2.y)/(n₁n₂)
s←(v1.x×v2.y−v1.y×v2.x)/(n₁n₂)
return SIGN(s)×arccos(c)
end function
function ANGLE(v1, v2)
p←PRINCIPAL-ANGLE(v1, v2)
if p←0 then
    return p+2π
else
    return p
end if
end function.
```

Computing a boundary area may be provided by the subject technology. The following function computes the area of the boundary given by the arrays of symbolic expressions x, y representing curve functions, arrays of parameter interval bounds $t_1$, $t_2$, array of curve orientations o and the number of curves K:

```
function AREA(x, y, t₁, t₂, o, K, ϵ, M)
j←1
for k←−1, K do
    τ[k]←DISCRETIZATION(x[k], y[k], t₁[k], t₂[k], M, ϵ, β)
    n←LENGTH(τ[k])
    for i'←1, n do
        if o[k]>0 then
            i←i'
```

```
            else
                i←n+1-i'
            end if
            x[j]←EVALUATE(x[k], τ[k][i])
            y[j]←(y[k], τ[k][i])
            j←j+1
        end for
        j←j-1
    end for
    a←0
    for i←1, j-1 do
        a←a+(x[i]y[i+1]-y[i]x[i+1])/2
    end for
    return a
end function.
```

The subject technology may determine offset boundary curves. The following function derives offset boundary curves and offset vertex points for the boundary given by arrays of symbolic expressions x, y representing curve functions, arrays of parameter interval bounds $t_1$, $t_2$, array of curve orientations o, the number of curves N and the offset distance D:

```
function OFFSET-CURVES(x, y, t₁, t₂, o, N, D)
    for i←-1, N do
        c[i].x[0]←x[i]
        c[i].y[0]←y[i]
        c[i].x[1]←DERIVE(x[i])
        c[i].y[1]←DERIVE(y[i])
        c[i].t1←t1[i]
        c[i].t2←t2[i]
        c[i].o←o[i]
    end for
    curves←-EMPTY-LIST
    j←1
    for i←1, N do
        dx←DERIVE(x[i])
        dy←DERIVE(y[i])
        dn←SQRT(SUM(POWER(dx, 2), POWER(dy, 2)))
        curve.x←SUM(x[i], PRODUCT(NUMBER(D), QUOTIENT(dy, dn)))
        curve.y←DIFFERENCE(y[i], PRODUCT(NUMBER(D), QUOTIENT(dx, dn)))
        curve. t1←t₁[i]
        curve.t2←t₂[i]
        curve.o←o[i]
        curve.i←i
        APPEND(curves, curve)
        j←MOD(i+1, N+1)
        tangent1←TANGENT(c[i], LAST(c[i]))
        tangent2←TANGENT(c[j], FIRST(c[j]))
        pa←PRINCIPAL-ANGLE(tangent1, tangent2)
        if pa>0∧D>0∨pa←0∧D←0 then
            xaxis.x←1
            xaxis.y←0
            a←ANGLExaxis, tangent1-π/2
            da←-ANGLE(tangent1, tangent2)-
            vx←NUMBER(EVALUATE(x[i], LAST(c[i])))
            vy←NUMBER(EVALUATE(y[i], LAST(c[i])))
            dvx←PRODUCT(NUMBER(D), COS(PARAMETER))
            dvy←PRODUCT(NUMBER(D), SIN(PARAMETER))
            curve.x←SUM(vx, dvx)
            curve.y←SUM(vy, dvy)
            curve.t1←MIN(a, a+da)
            curve.t2←MAX(a, a+da)
            curve.o←D/|D|
            curve.i←0
            APPEND(curves, curve)
        end if
    end for
    return curves
end function.
```

The result is a list of objects of type curve' with components curve.x and curve.y containing symbolic expressions representing offset boundary curve functions, curve.t1 and curve.t2 containing parameter interval bounds of the offset boundary curve, curve.o containing its orientation, and curve.i containing the index of the original curve from which the offset curve has been derived within the input arrays, or 0 if the curve has been derived from the vertex point.

The subject technology may also provide for determining nodes. For example, the following function will return an associative table of node assignments for all intersections which are given as a list intersections of objects i with the component i.point containing the intersection point. The nodes are assigned to the intersection points by finding the transitive closure of the relation (32):

```
function NODES(intersections, μ)
    j←1
    for i∈intersections do
        intersection[j]←i
        equivallent[j]←j
        node[i]←0
        j←j+1
    end for
    N←j-1
    for j←1, N do
        for k←j+1, N do
            dx←intersection[j].point.x-intersection[k].point.x
            dy←intersection[j].point.y-intersection[k].point.y
            if √(dx²+dy²←μ then
                l←equivallent[j]
                equivallent[j]←k
                equivallent[k]←l
            end if
        end for
    end for
    n←1
    for j←1, N do
        if node[intersection[j]]=0 then
            node[intersection[,i]]←n
            k←equivallent[j]
            while k≠j do
                node[intersection[k]]←n
            end while
            n←n+1
        end if
    end for
    return node
end function.
```

The subject technology may also provide for determining curve sections. For example, the following function will find all intersections of the curves and return the list of all sections of curves between the intersections together with the information about the nodes at endpoints of each section. The inputs are the arrays x, y of functions to calculate the points and the derivatives of the curves, the arrays $t_1$, $t_2$ of lower and upper parameter values, the array o of the curve orientations, the number of curves N, the minimum distance μ between the intersections belonging to the same node, and the parameters ∈, η, λ, ND, β required by the function for finding the curve intersections. The output is a list of objects of type section with components section.x and section.y containing the arrays of symbolic expressions to calculate the points and the derivatives of the section, section.t1 and section.t2 containing the lower and the higher parameter values $\tau_1$ and $\tau_2$ of the curve section, section.o containing the orientation of the section, section.node1 and section.node2 containing the nodes at the first and the last point of the section, and section.i containing the index of the curve from which the curve section has been derived:

```
function SECTIONS (x, y, t₁, t₂, o, N, ε, η, λ, n_D, β, μ)
    intersections ← CURVE-INTERSECTIONS
        (x, y, t₁, t₂, o, N, ε, η, λ, n_D, β, μ)
    for i ∈ intersections do
        i.point.x ← (EVALUATE(x[i.c1](i.t1) +
            EVALUATE(x[i.c2](i.t2))) / 2
        i.point.y ← (EVALUATE(y[i.c1](i.t1) +
            EVALUATE(y[i.c2](i.t2))) / 2
    end for
    node ← NODES(intersections.μ)
    sections ← EMPTY-LIST
    for k ← 1, N do
        for intersection ∈ intersections do
            I ← EMPTY-LIST
            if i.c1 = k then
                APPEND (I, intersection)
            end if
        end for
        n ← length(I)
        if n > 1 then
            I ← SORT(I, i1.t1 < i2.t1)
            i ← 1
            while i < n do
                j ← i + 1
                while j ≤ n ∧ node[I[i]] = node[I[j]] do
                    j ← j + 1
                end while
                if j < n then
                    section.x[0] ← x[k]
                    section.y[0] ← y[k]
                    for m ← 1, 2 do
                        section.x[m] ← DERIVE(section.x[m − 1])
                        section.y[m] ← DERIVE(section.y[m − 1])
                    end for
                    section.o ← o[k]
                    section.i ← k
                    section.t1 ← I[i].t1
                    section.t2 ← I[j].t1
                    if o(k) > 0 then
                        section.node1 ← node[I[i]]
                        section.node2 ← node[I[j]]
                    else
                        section.node1 ← node[I[j]]
                        section.node2 ← node[I[i]]
                    end if
                    APPEND(sections, section)
                end if
                i ← j
            end while
        end if
    end for
    return sections
end function.
```

The subject technology may also provide for determining section successors. For example, the function to find the successors of the sections may be defined. The arguments are the sign S and the list sections containing the objects of type section with components section.o containing the orientation of the section, section.node1 and section.node2 containing the nodes at the first and the last point of the section, section.x and section.y containing the functions to calculate the points and the derivatives of the section, and section.t1 and section.t2 containing the lower and the higher parameter values $\tau_1$ and $\tau_2$ of the curve section. The result is an associative table successor associating to each section its successor section successor[section]:

```
function SUCCESSORS(sections, S)
    for s ∈ sections do
        angle[s.node1] ← 2πS
        angle[s.node2] ← 2πS
    end for
    nodes ← EMPTY-LIST
    for s1 ∈ sections do
        for s2 ∈ sections do
            if s1.node2 = s2.node1 then
                node ← s1.node2
                if node ∉ nodes then
                    APPEND(nodes, node)
                end if
                T₁ ← × TANGENT(s1, LAST(s1))
                T₂ ← × TANGENT(s1, FIRST(s1))
                C₁ ← S × CURVATURE(s1, LAST(s1))
                C₂ ← S × CURVATURE(s1, FIRST(s1))
                α ← S × ANGLE(T₁, T₂)
                if |α| ≠ π then
                    if angle[node] = 2π ∨ α < angle[node] then
                        angle[node] ← α
                        section1[node] ← s1
                        section2[node] ← s2
                        tangent1[node] ← T₁
                        tangent2[node] ← T₂
                        curvature1[node] ← C₁
                        curvature2[node] ← C₂
                    else
                        if α = angle[node] then
                            α₁ ← ANGLE(T₁, tangent1[node])
                            α₂ ← ANGLE(T₁, tangent1[node])
                            if α1 = 0 ∧ C₁ < curvature1[node] then
                                section1[node] ← s1
                                curvature1[node] ← C₁
                            end if
                            if α2 = 0 ∧ C₂ < curvature2[node] then
                                section2[node] ← s2
                                curvature2[node] ← C₂
                            end if
                        end if
                    end if
                end if
            end if
        end for
    end for
    for node ∈ nodes do
        successor[section1[node]] ← section2[node]
    end for
    return successor
end function.
```

The subject technology may also provide for determining boundaries. For example, the following function finds all boundaries given a list of sections and the associative table successor associating to each section its successor section successor[section]. The result is a list of objects of type boundary, each of which is a list of objects of type section:

```
function BOUNDARIES(sections, successor)
    boundaries ← EMPTY-LIST
    for section ∈ sections do
        visited[section] ← FALSE
    end for
    for section ∈ sections do
        if ¬visited(section) then
            boundary EMPTY-LIST
            s ← section
        end if
        repeat
            visited[s] ← TRUE
            APPEND(boundary, s)
            s ← successor[s]
        until s = section
```

```
    if s≠section then
        APPEND(boundaries, boundary)
    end if
end for
return boundaries
end function.
```

The subject technology may also provide for minimum width and minimum distance checking. For example, the following function will check minimum width $W_{min}$ or minimum distance $D_{min}$ for the boundary set B, which is given by the number M of boundaries $b_m$ in B, the array N[1, ..., M] of the numbers of curves in each $b_m$, the arrays of symbolic expressions representing curve functions x[m=1, ..., M][1, ..., N[m]] and y[m=1, ..., M][1, ..., N[m]], the arrays t1$_l$[m=1, ..., M][1, ..., N[m]] and t1$_r$[m=1, ..., M][1, ..., N[m]] of the curve parameters and the array o$_1$[m=1, ..., M][1, ..., N[m]] of curve orientations:

```
function CHECK(M, x, y, t₁, t₂, o, N, C_min)
    if C_min>0 then
        W_min←-C_min
        D←-W_min/2
        S←1
        A←-1
    else
        D_min←C_min
        D←D_min/2
        S←-1
        A←1
    end if
    j←1
    for m←1, M do
        C←OFFSET-CURVES(x[m], y[m], t₁[m], t₂[m], o[m], N[m], D)
        for c∈C do
            x'[j]←c.x
            y'[j]←c.y
            t'₁[j]←c.t1
            t'₂[j]←c.t2
            o'[j]←c.o
            m'[j]←m
            i'[j]←c.i
            j←j+1
        end for
    end for
    N'←j-1
    sections←SECTIONS(x', y', t'₁, t'₂, o', N', ∈, η, λ, n, μ)
    successor←SUCCESSORS(sections, S)
    boundaries←BOUNDARIES(sections, successor)
    B←EMPTY-LIST
    for boundary∈boundaries do
        i←1
        for section∈boundary do
            b.x[i]←section.x[0]
            b.y[i]←section.y[0]
            b.t1[i]←section.t1
            b.t2[i]←section.t2
            b.o[i]←section.o
            i←i+1
        end for
        b.N←i-1
        b.a←AREA(b.x, b.y, b.t1, b.t2, b.o, b.N, ∈, n)
        if b.a×A>0 then
            b.curves←EMPTY-LIST
            for section E boundary do
                curve.m←m'[section.i]
                curve.i←i'[section.i]
                curve.t1←section.t1
                curve.t2←section.t2
                APPEND(b.curves, curve)
            end for
            APPEND(B, b)
        end if
    end for
    return B
end function.
```

The result is a list of objects of type boundary representing violation boundaries with components boundary.N containing the number of curves in the violation boundary, boundary.x, boundary.y containing the arrays of symbolic expressions representing curve functions, boundary.t1, boundary.t1 containing the arrays of parameter interval bounds, boundary.o containing the array of curve orientations, boundary.area containing the area of the violation boundary, and boundary.curves containing the list of violation curve section associated with the violation boundary. Each element of boundary.curves is an object of type curve with component curve.m containing the index m of the original boundary $b_m$, curves.i containing the index i of the curve $c_{mi}$ within the boundary $b_m$, and curve.t1, curve.t1 containing the parameter interval bounds of the violation curve section.

In a test of the method, the minimum width and the minimum distance have been checked for a boundary defined by an elliptical curve with the lengths of the axes modulated by 8 periods of a cosine function:

$$x(t)=(80+20 \cos(8t))\cos(t)$$

$$y(t)=(50+20 \cos(8t))\sin(t)$$

$$t \in [-\pi,\pi] \tag{37}$$

Figure 9:
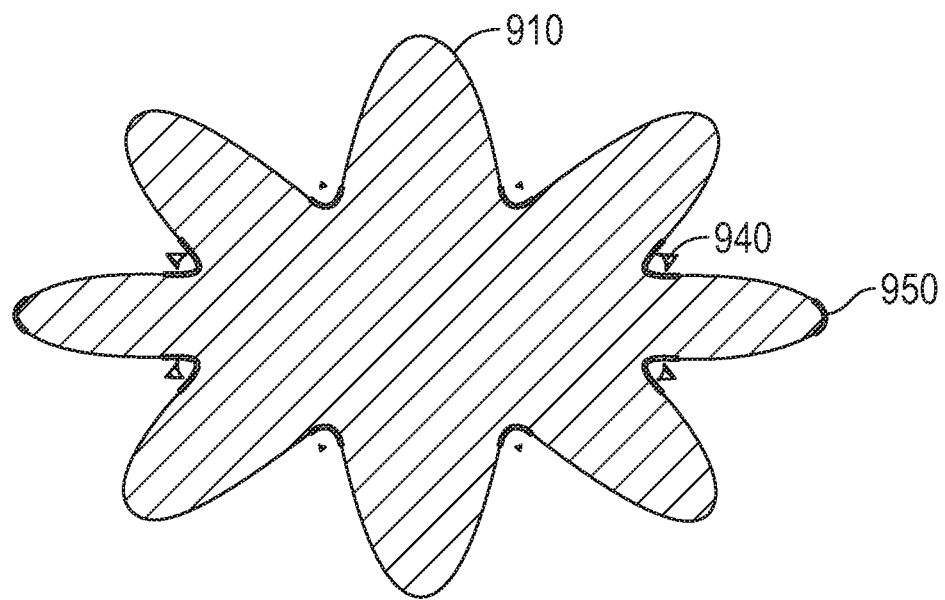
FIG. 9 illustrates example results of boundary checking, according to some embodiments.
Figure 10:
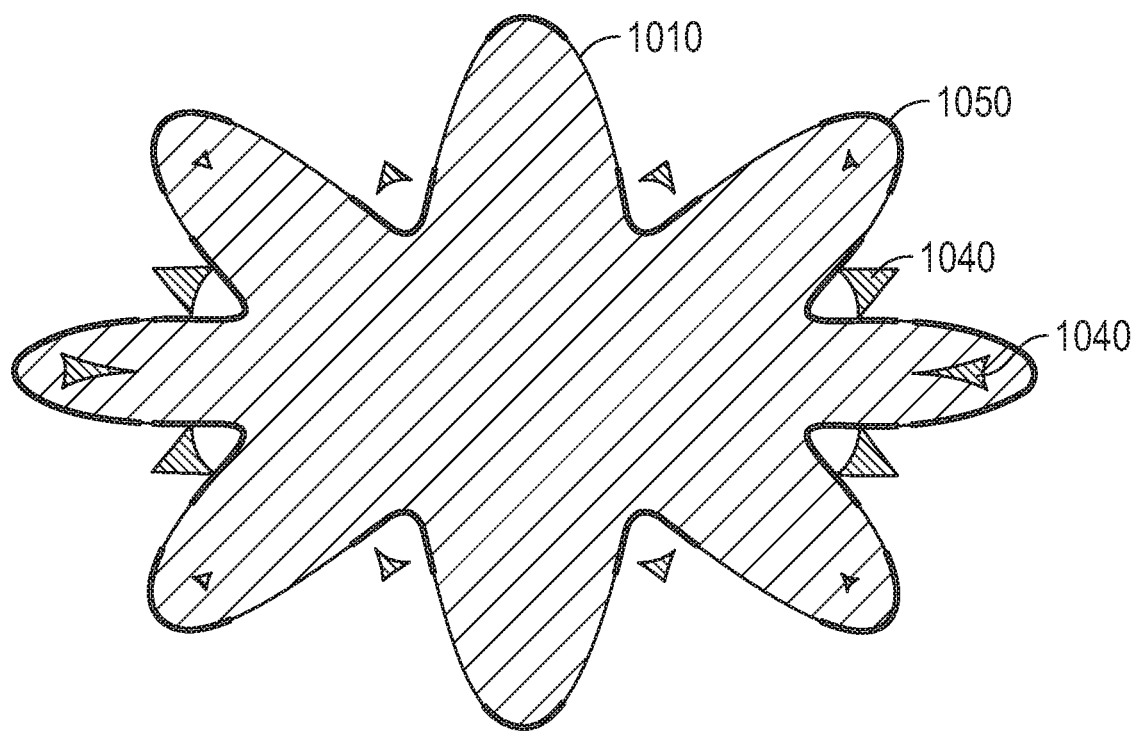
FIG. 10 illustrates example results of boundary checking, according to some embodiments.

For example, FIG. 9 shows the results of checking the boundary 910 with the minimum width value of $W_{min}$=10 and the minimum distance value of $D_{min}$=10. As another example, FIG. 10 shows the results of checking the boundary 1010 with the minimum width value of $W_{min}$=20 and the minimum distance value of $D_{min}$=20. The violations of the minimum width and the minimum distance design rule are shown by areas 940, 1040 indicating the overlaps of the offset curves (not shown) and by thick lines 950, 1050 indicating the sections of the boundary curves causing the violations. All violations in this case are either maximum convex curvature violations κ>1/$W_{min}$ or maximum concave curvature violations κ<-1/$D_{min}$.

Figure 11:
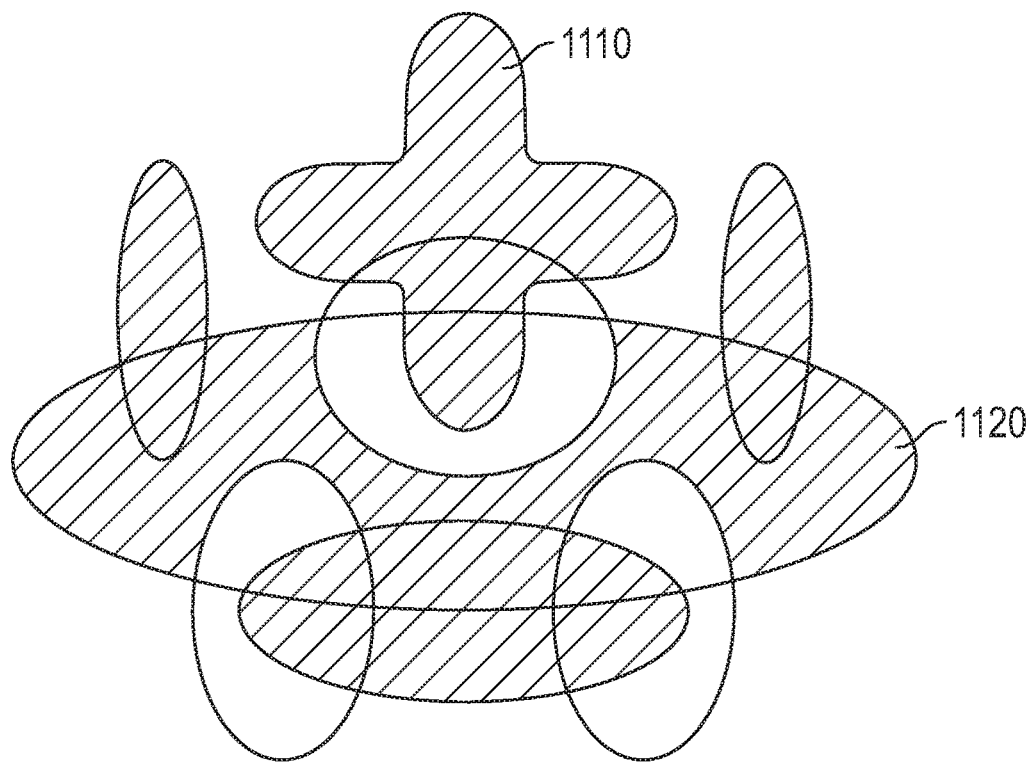
FIG. 11 illustrates example results of boundary checking, according to some embodiments.

In another test of the method, the minimum width and the minimum distance have been checked for two boundaries 1110, 1120 in FIG. 11. The first boundary 1110 is defined by an elliptical curve with the lengths of the axes modulated by 4 periods of a cosine function:

$$x(t)=(50+20 \cos(4t))\cos(t)$$

$$y(t)=(50+20 \cos(4t))\sin(t)$$

$$t \in [-\pi,\pi] \tag{38}$$

The second boundary 1120 is the result of successive application of Boolean operations on boundaries defined by elliptical curves of various sizes.

Figure 12:
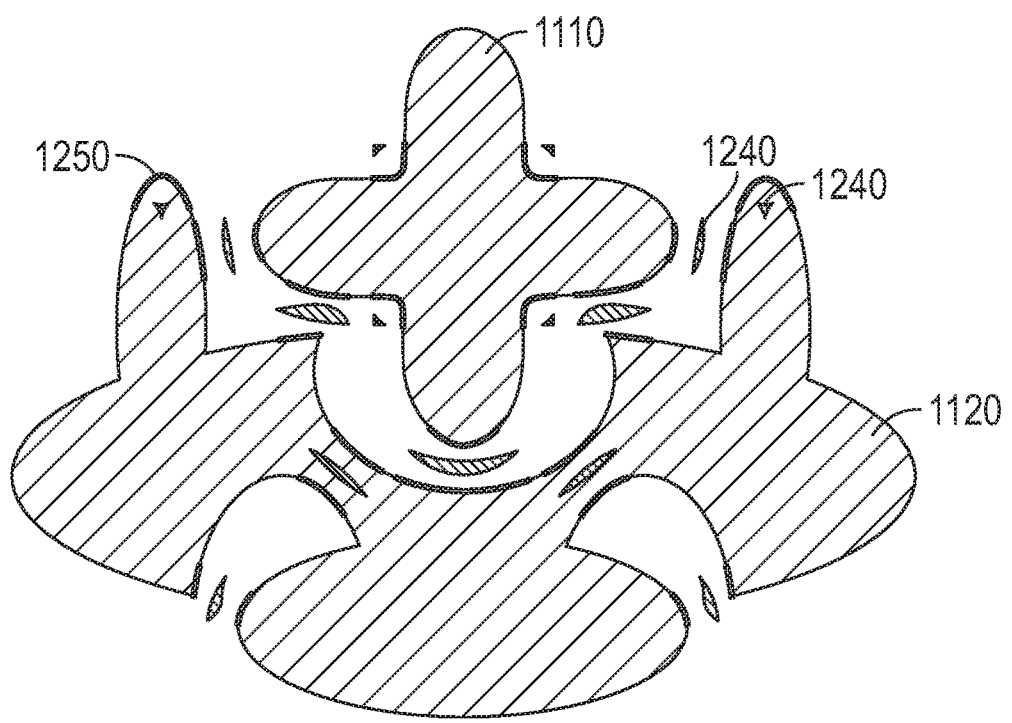
FIG. 12 illustrates example results of boundary checking, according to some embodiments.
Figure 13:
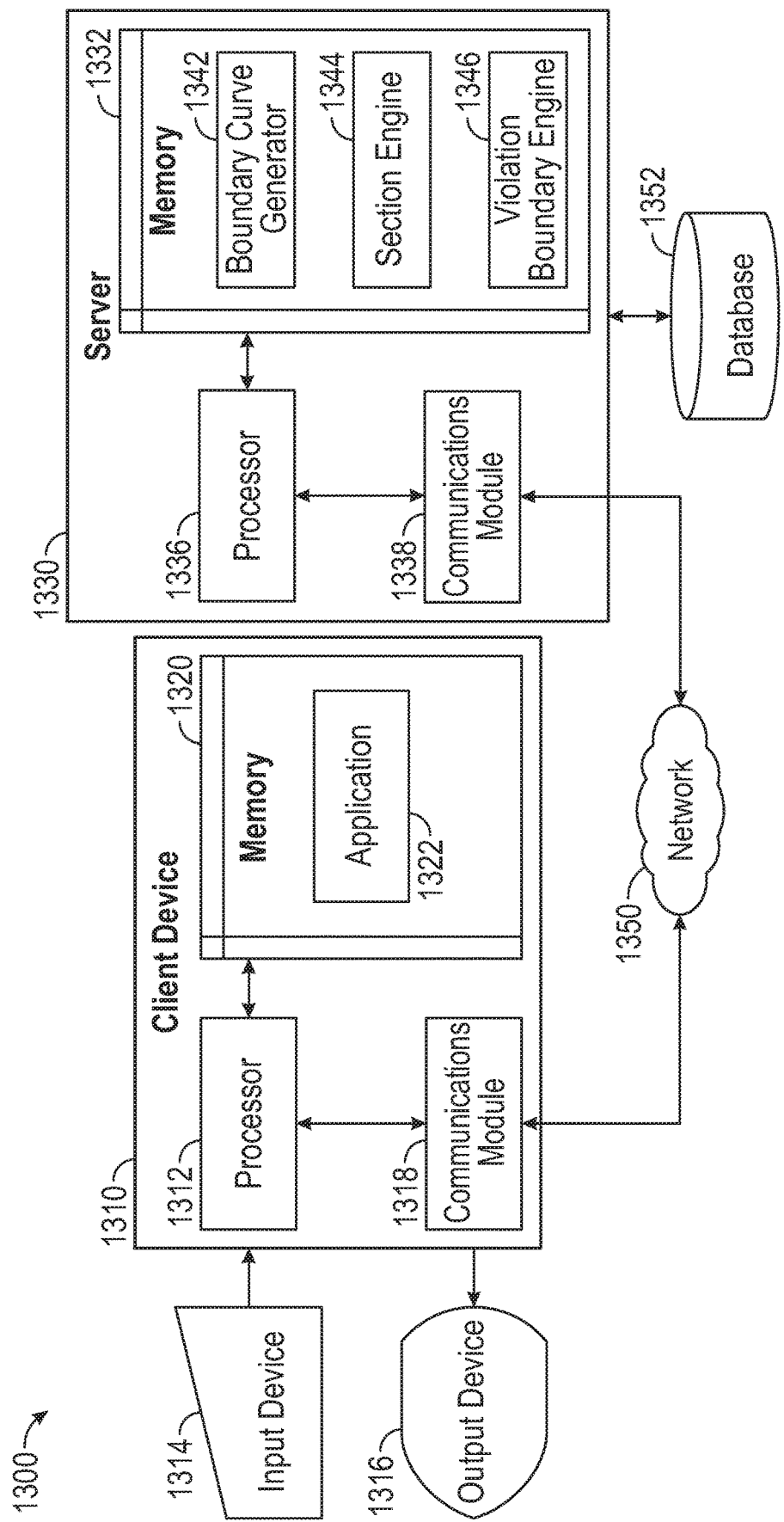
FIG. 13 illustrates an example architecture suitable for determining minimum width, minimum distance and maximum curvature of planar region boundaries in IC design, according to some embodiments.

FIG. 12 shows the results of checking the two boundaries 1110, 1120 with the minimum width value of $W_{min}$=20 and the minimum distance value of $D_{min}$=20. The violations of the minimum width and the minimum distance design rule are shown by areas 1240 indicating the overlaps of the offset curves (not shown) and by thick lines 1250 indicating the sections of the boundary curves causing the violations. In this case there are five different types of violations:

Maximum convex curvature violations κ>1/$W_{min}$
Maximum concave curvature violations κ<−1/$D_{min}$.
Minimum width violations between curve sections on the same boundary
Minimum distance violations between curves sections on the same boundary
Minimum distance violations between curves sections on different boundaries FIG. 13 illustrates an example architecture 1300 suitable for determining minimum width, minimum distance and maximum curvature of planar region boundaries in a high-yield IC design, according to some embodiments. A client device 1310 may include a processor 1312 and a communications module 1318 that enables client device 1310 to communicate with other devices via a network 1350. Client device 1310 also includes a memory 1320 for storing instructions which, when executed by processor 1312, cause client device 1310 to perform at least some of the steps in methods described herein. In some embodiments, the instructions stored in memory 1320 may include an application 1322 hosted by an external server (e.g., server 1330). In some embodiments, application 1322 is configured to provide width, distance and curvature parameters in a high yield IC circuit. Client device 1310 may also include accessories as an input device 1314 (e.g., a mouse, a pointer, a keyboard, a touchscreen display, a camera, a speaker, and the like) and an output device 1316 (e.g., a display, a speaker, a camera, and the like).

Client device 1310 may be communicatively coupled with a server 1330 via a network 1350. Server 1330 may include a processor 1336 and a communications module 1338 to activate information exchanges through network 1350 (e.g., with client device 1310). Server 1330 may also include a memory 1332 coupled to processor 1336. Memory 1332 stores instructions which, when executed by processor 1336, cause server 1330 to perform at least some of the steps in methods described herein. In some embodiments, memory 1332 may include boundary curve generator 1342, a section engine 1344, and a violation boundary engine 1346. Server 1330 may include, or be communicatively coupled with, a database 1352. Database 1352 may include multiple IC configurations, boundary and section parameters/functions, libraries, and resources collected historically by server 1330 for previous IC designs and boundary analysis that may be helpful for boundary curve generator 1342, section engine 1344 and violation boundary engine 1346 in solving for a current IC design.

In some embodiments, boundary curve generator 1342 is configured to create a set of offset boundary curves for each boundary curve in a given boundary set. In some embodiments, section engine 1344 is configured to determine all sections between intersection points of offset boundary curves, and to determine section successors for the determined sections. Sample violation boundary engine 1346 is configured to determine and provide for display all violation boundaries formed by the sections.

In some embodiments, a designer using application 1322 in client device 1310 may not have a direct interaction with, or knowledge of, the steps performed by any one of boundary curve generator 1342, section engine 1344, or sample violation boundary engine 1346.

In some embodiments, application 1322 may be partially or completely self-contained within client device 1310, including a separate library containing boundary curve generator 1342, section engine 1344, or sample violation boundary engine 1346 in a database directly accessible by, or being part of memory 1320, in client device 1310. Accordingly, the user may perform some, or all, of the steps in methods consistent with the present disclosure without communicating with the external server through network 1350.

Figure 14:
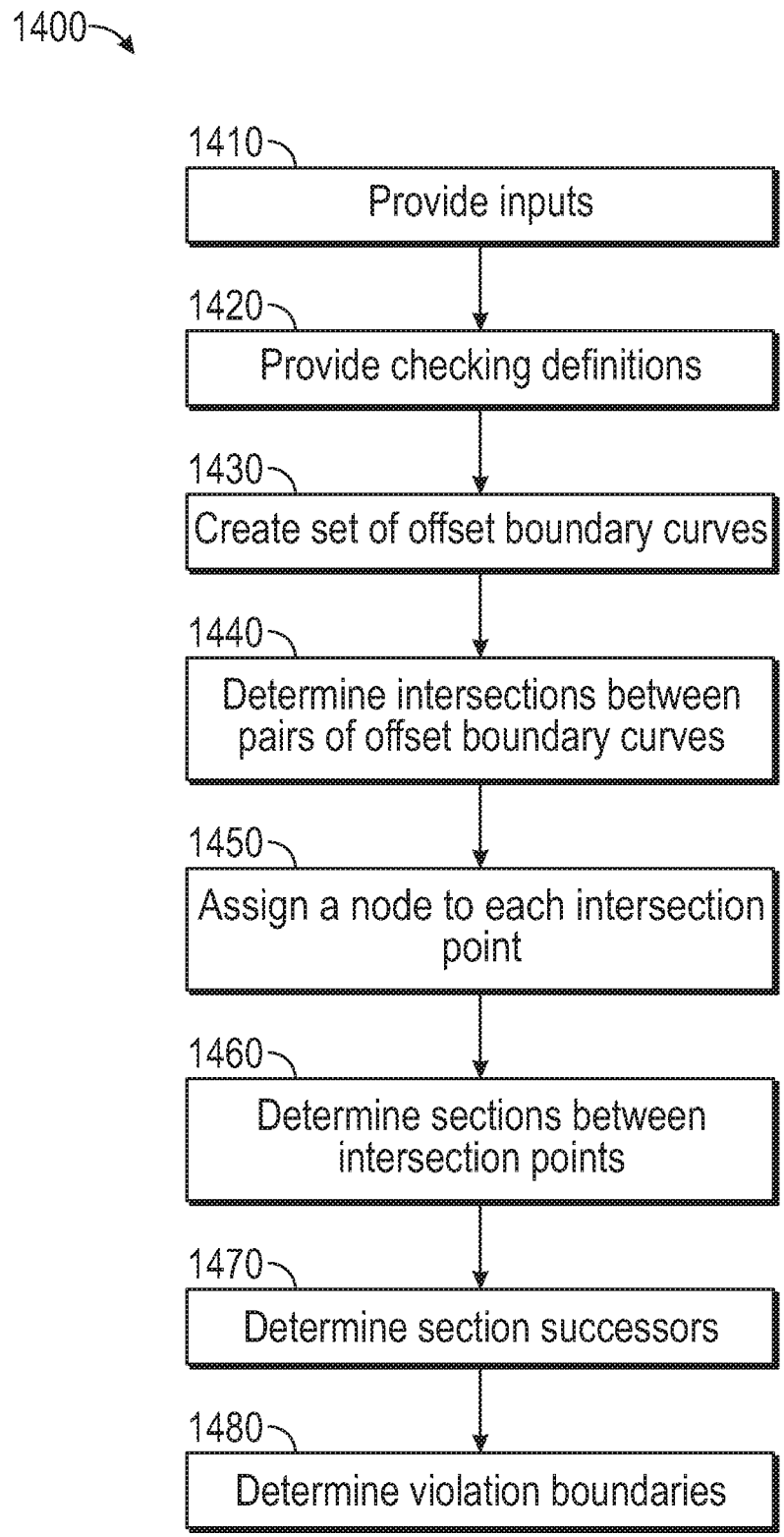
FIG. 14 is a flow chart illustrating steps in a method for determining minimum width, minimum distance and maximum curvature violations for a boundary set, according to some embodiments.

FIG. 14 illustrates a method 1400 for determining minimum width, minimum distance and maximum curvature violations for a given input boundary set B. In step 1410, inputs are provided. Inputs may be, but are not limited to the number of boundaries M in the input boundary set B={$b_m$}, the number of boundary curves $N_m$ in each boundary $b_m \in B$, the list of $N_m$ boundary curves $c_{m1}, \ldots, c_{mNm}$ for each boundary $b_m \in B$, the minimum width $W_{min}$ or the minimum distance $D_{min}$, and the minimum distance μ under which two curve intersections are considered to belong to the same node.

In step 1420, checking definitions are assigned. For example, D=−$W_{min}$/2 may be defined for $W_{min}$ checking and D=$D_{min}$/2 may be defined for $D_{min}$ checking.

A set of offset boundary curves $\bar{b}'_m$ is created for each $b_m \in B$ in step 1430. For example, according to some embodiments, each curve $c_{mi}$ is offset and the resulting offset curve added to $\bar{c}'_{mi}$ to $\bar{b}'_m$. Then, all pairs of boundary curves $c_{mi}$, $c_{mj}$ with j=i+1 or i=$N_m$ and j=1 are determined and the angle $$\Delta\varphi_{mij} = \mathcal{P} \angle (T(r_{mi}(t_{mi2})), T(r_{mj}(t_{mj1}))) \tag{31}$$

is calculated. In addition, vertex point $c_{mij}$ is created for each $\Delta\varphi_{mij} > 0$ when D>0, or for each $\Delta\varphi_{mij} < 0$ when D<0. Further, each vertex point $c_{mij}$ is offset and the resulting offset vertex point is added to $\bar{c}'_{mij}$ to $\bar{b}'_m$.

In step 1440, all intersections $\bar{r}_i(\tau) = \bar{r}_j(\tau')$ between all pairs of offset boundary curves ($\bar{c}'_i$, $\bar{c}'_j$), where i, j=1, ..., N and i<j are determined and each intersection point is denoted by I(i, τ, j, τ').

In step 1450, a node n(i, τ, j, τ') is assigned to each intersection point I(i, τ, j, τ') such that two intersection points within distance μ are assigned to the same node:

$$|\bar{r}_i(\tau) - \bar{r}_k(\bar{\tau})| < \mu \Leftrightarrow n(i,\tau,j,\tau') = n(k,\bar{\tau},l,\bar{\tau}') \tag{32}$$

For each offset curve $\bar{c}'_k$, all sections between the intersection points are determined in step 1460. For example, according to some embodiments, a list of all intersection points I(i, τ, j, τ') with i=k is created. The list is sorted by the values of parameter τ in increasing order. In addition, for each adjacent pair of intersections (k, $\tau_1$, $j_1$, $\tau'_1$) and (k, $\tau_2$, $j_2$, $\tau'_2$) in the sorted list, section ($\bar{c}k(\tau_1, \tau_2)$, $n_1$, $n_2$) is created, where $\bar{c}_k(\tau_1, \tau_2)$ is the section of the curve $\bar{c}_k$ between parameter values τ1 and τ2 and n1=n(k,$t_F(\bar{c}_k(\tau_1, \tau_2))$, $j_1$, $\tau'_1$) and $n_2$=n(k,$t_L(\bar{c}_k(\tau_1, \tau_2))$, $j_2$, $\tau'_2$) are the nodes of the intersections at the first and the last point of the section $\bar{c}_k(\tau_1, \tau_2)$, respectively.

In step 1470, section successors are determined. For example, according to some embodiments, S=1 is defined for $W_{min}$ checking or S=−1 is defined for $D_{min}$ checking. Also, all pairs of connected sections s=($\bar{c}_k(\tau_1, \tau_2)$, $n_1$, $n_2$) and s'=$\bar{c}_l(\tau'_1, \tau'_2)$, $n'_1 n'_2$) such that $n_2$=$n'_1$ are determined. In addition, for each pair of connected sections (s, s'), the angle between the curve tangents at the connecting node n=$n_2$=$n'_1$ is determined, where $$\alpha(s,s',n) = \angle (T(\bar{r}_k(t_L(\bar{c}_k(\tau_1,\tau_2)))), T(\bar{r}_l(t_F(\bar{c}_l(\tau_1',\tau_2'))))). \tag{33}$$

For each pair of connected sections (s, s'), signed curvatures of the curves at the connecting node n=$n_2$=$n'$1 are determined, where $$\kappa(s,n) = S_\kappa(\bar{r}_k(t_L(\bar{c}_k(\tau_1,\tau_2)))) \tag{34}$$

$$\kappa(s,n) = S_\kappa(\bar{r}_l(t_F(\bar{c}_l(\tau_1',\tau_2')))) \tag{35}$$

Here, all pairs of connected sections (s, s') for which |α(s, s', n)|=π are ignored and for each node n, the pair of connected sections ($s_m$, $s'_m$) for which Sα($s_m$, $s'_m$, n) is minimum are determined. In addition, from all such pairs for a given node n, the one pair for which κ($s_m$, n) and κ($s'_m$, n) are minimum is determined and the successor section of $s_m$, i.e. $s'_m$=σ($s_m$) is defined as $s'_m$.

The method 1400 also includes determining all violation boundaries formed by sections in step 1480. For example, according to some embodiments, a list Σ of sections s is created for which the successor σ(s) has been defined and each section s from Σ is defined as not yet visited. In addition, for each section s from Σ, the method is configured to: (i) skip s if it has already been visited; (ii) otherwise, create a new boundary $\bar{b}$ and assign s'←s; (iii) add s' to the violation boundary $\bar{b}$ and mark s' as visited; (iv) assign s'←σ(s'); (v) if s'≠s, proceed with (iii); and (vi) otherwise, if s'=s, add boundary $\bar{b}$ to the resulting violation boundary set $\bar{\beta}$ and proceed with (i). Also, area A($\bar{b}$) of each violation boundary is calculated and only those with A($\bar{b}$)<0, when checking $W_{min}$ and A($\bar{b}$)>0, when checking $D_{min}$ are retained in the boundary set $\bar{\beta}$. Further, for each curve section $\bar{c}(\tau_1, \tau_2)$ of each of the violation boundaries $\bar{b}$, curve section c($\tau_1, \tau_2$) is added to the set of violation curves. In some embodiments, step 1480 includes forming a layout to manufacture a mask for fabricating the integrated circuit according to the identified boundary set when there are no violation boundaries formed by the section. In some embodiments, step 1480 includes modifying the boundary features and curves in the circuit design when a violation is found, so that the new circuit design results in no violations, before a mask layout is generated.

At least some of the steps in method 1400 may be performed by a computer having a processor executing commands stored in a memory of the computer. Further, steps as disclosed in method 1400 may include retrieving, editing, and/or storing files in a database that is part of, or is communicably coupled to, the computer. Methods consistent with the present disclosure may include at least some, but not all, of the steps illustrated in method 1400, performed in a different sequence. Furthermore, methods consistent with the present disclosure may include at least two or more steps as in method 1400, performed overlapping in time, or almost simultaneously.

In some embodiments, at least one or more of the steps in method 1400 may be performed in a cloud computing environment, wherein a computer may include servers, such as a master server and a slave server. Accordingly, at least some of the steps illustrated in method 1400 may be performed in parallel in different processors, following separate computational threads. For example, each of the separate computational threads may be performed by at least one of the slave servers in each of multiple applications and processors dedicated to the specific computational thread.

Figure 15:
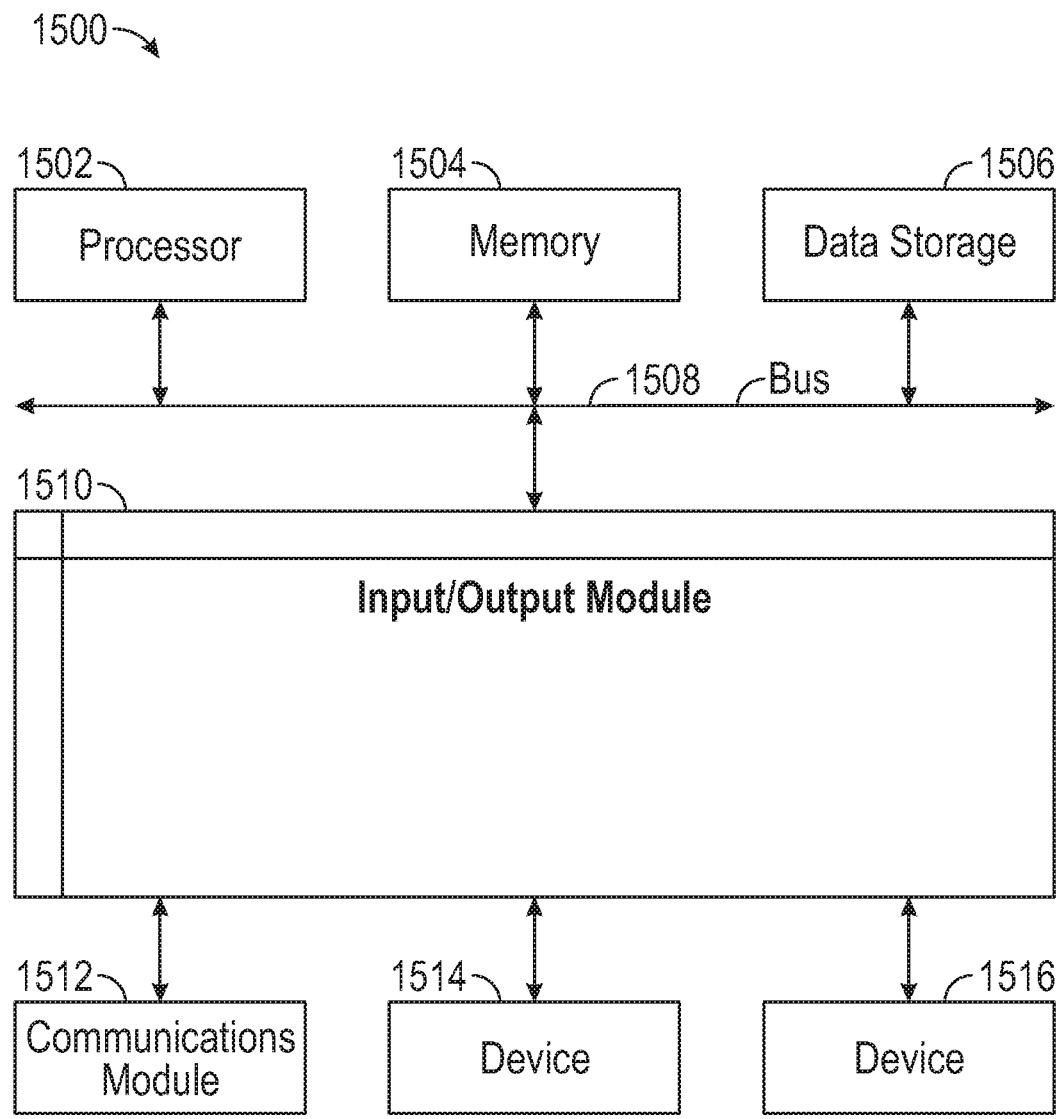
FIG. 15 is a block diagram illustrating an example computer system, according to some embodiments.

FIG. 15 is a block diagram illustrating an example computer system 1500 with which the methods and steps illustrated in FIG. 14 can be implemented, according to some embodiments. In certain aspects, computer system 1500 can be implemented using hardware or a combination of software and hardware, either in a dedicated server, integrated into another entity, or distributed across multiple entities.

Computer system 1500 includes a bus 1508 or other communication mechanism for communicating information, and a processor 1502 coupled with bus 1508 for processing information. By way of example, computer system 1500 can be implemented with one or more processors 1502. Processor 1502 can be a general-purpose microprocessor, a micro-controller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 1502 may include modules and circuits configured as a 'placing' tool or engine, or a 'routing' tool or engine, to place devices and route channels in a circuit layout, respectively and as disclosed herein.

Computer system 1500 includes, in addition to hardware, code that creates an execution environment for the computer program in question, e.g., code that constitutes processor firmware, a protocol stack, a database management system, an operating system, or a combination of one or more of them stored in an included memory 1504, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 1508 for storing information and instructions to be executed by processor 1502. Processor 1502 and memory 1504 can be supplemented by, or incorporated in, special purpose logic circuitry.

The instructions may be stored in memory 1504 and implemented in one or more computer program products, e.g., one or more modules of computer program instructions encoded on a computer readable medium for execution by, or to control the operation of, the computer system 1500, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis languages, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 1504 may also be used for storing temporary variable or other intermediate information during execution of instructions to be executed by processor 1502.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 1500 further includes a data storage device 1506 such as a magnetic disk or optical disk, coupled to bus 1508 for storing information and instructions.

Computer system 1500 is coupled via input/output module 1510 to various devices. The input/output module 1510 is any input/output module. Example input/output modules 1510 include data ports such as USB ports. The input/output module 1510 is configured to connect to a communications module 1512. Example communications modules 1512 include networking interface cards, such as Ethernet cards and modems. In certain aspects, the input/output module 1510 is configured to connect to a plurality of devices, such as an input device 1514 and/or an output device 1516. Example input devices 1514 include a keyboard and a pointing device, e.g., a mouse or a trackball, by which a user can provide input to the computer system 1500. Other kinds of input devices 1514 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 1516 include display devices, such as an LED (light emitting diode), CRT (cathode ray tube), or LCD (liquid crystal display) screen, for displaying information to the user.

Methods as disclosed herein may be performed by computer system 1500 in response to processor 1502 executing one or more sequences of one or more instructions contained in memory 1504. Such instructions may be read into memory 1504 from another machine-readable medium, such as data storage device 1506. Execution of the sequences of instructions contained in main memory 1504 causes processor 1502 to perform the process steps described herein (e.g., as in methods). One or more processors in a multi-processing arrangement may also be employed to execute the sequences of instructions contained in memory 1504. In alternative aspects, hard-wired circuitry may be used in place of, or in combination with, software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 1500 includes servers and personal computer devices. A personal computing device and server are generally remote from each other and typically interact through a communication network. The relationship of client and server arises by virtue of computer programs running on the respective computers and having a client-server relationship to each other. Computer system 1500 can be, for example, and without limitation, a desktop computer, laptop computer, or tablet computer. Computer system 1500 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 1502 for execution. Such a medium may take many forms, including, but not limited to, non-volatile media, volatile media, and transmission media. Non-volatile media include, for example, optical disks, magnetic disks, or flash memory, such as data storage device 1506. Volatile media include dynamic memory, such as memory 1504. Transmission media include coaxial cables, copper wire, and fiber optics, including the wires that include bus 1508. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in either one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or "the like" is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method, comprising:
   providing a plurality of inputs for an identified boundary set in a design for an integrated circuit;
   determining a definition of distance for one of a minimum width checking and a minimum distance checking;
   creating a set of the offset boundary curves;
   determining all intersections between all pairs of offset boundary curves;

assigning a node to each intersection point of intersection points at said all intersection;
determining all sections between intersection points for each boundary curve of said set of offset boundary curves;
determining successors of the all sections;
determining all violation boundaries formed by the all sections; and
forming a layout to manufacture a mask for fabricating the integrated circuit according to the identified boundary set when there are no violation boundaries formed by the sections.

2. The computer-implemented method of claim 1, wherein the plurality of inputs comprises:
a number of boundaries M in a boundary set $B=\{b_m\}$;
a number of boundary curves $N_m$ in each boundary $b_m \in B$;
a list of $N_m$ boundary curves $c_{m1}, \ldots, c_{mNm}$ for each boundary $b_m \in B$;
a minimum width $W_{min}$;
a minimum distance $D_{min}$; and
a minimum distance $\mu$ under which two curve intersections are considered to belong to a same mode.

3. The computer-implemented method of claim 2, wherein the definition of distance comprises one of $D=-W_{min}/2$ for $W_{min}$ checking and $D=D_{min}/2$ for $D_{min}$ checking.

4. The computer-implemented method of claim 2, wherein the creating a set of offset boundary curves comprises creating a set of offset boundary curves $\bar{b}'_m$ for each $b_m \in B$ by:
offsetting each curve $c_{mi}$;
adding resulting offset curve $\bar{c}'_{mi}$ to $\bar{b}'_m$;
determining all pairs of boundary curves $c_{mi}$, $c_{mj}$ with $j=i+1$ or $i=N_m$ and $j=1$;
calculating an angle $\Delta\varphi_{mij} = \mathcal{P} \angle (T(r_{mi}(t_{mi2})), T(r_{mj}(t_{mj1})))$;
creating a vertex point $c_{mij}$ for each angle $\Delta\varphi_{mij}>0$ when $D>0$, or for each angle $\Delta\varphi_{mij}<0$ when $D<0$;
offsetting each vertex point $c_{mij}$; and
adding resulting offset vertex point $\bar{c}'_{mij}$ to $\bar{b}'_m$.

5. The computer-implemented method of claim 1, wherein the determining all intersections between all pairs of offset boundary curves comprises:
determining all intersections $\bar{r}_i(\tau)=\bar{r}_j(\tau')$ between all pairs of offset boundary curves $(\bar{c}'_i, \bar{c}'_j)$, where $i, j=1, \ldots, N$ and $i<j$; and
denoting each intersection point by $I(i, \tau, j, \tau')$.

6. The computer-implemented method of claim 1, wherein the assigning a node to each intersection point comprises:
assigning to each intersection point $I(i, \tau, j, \tau')$ a node $n(i, \tau, j, \tau')$ such that two intersection points within distance $\mu$ are assigned to the same node, where $|\bar{r}_i(\tau)-\bar{r}_k(\tau)|<\mu \Leftrightarrow n(i,\tau,j,\tau')=n(k,\tau,l,\tau')$.

7. The computer-implemented method of claim 1, wherein the determining all sections between intersection points for each offset boundary curve comprises:
creating a list of all intersection points $I(i, \tau, j, \tau')$ with $i=k$;
sorting the list by values of parameter $\tau$ in increasing order; and
creating, for each adjacent pair of intersections $(k, \tau_1, j_1, \tau'_1)$ and $(k, \tau_2, j_2, \tau'_2)$ in the sorted list, a section $(\bar{c}_k(\tau_1, \tau_2), n_1, n_2)$, where $\bar{c}_k(\tau_1, \tau_2)$ is a section of curve $\bar{c}_k$ between parameter values $\tau 1$ and $\tau 2$ and $n1=n(k,t_F(\bar{c}_k(\tau_1, \tau_2)), j_1, \tau'_1)$ and $n_2=n(k,t_L(\bar{c}_k(\tau_1, \tau_2)), j_2, \tau'_2)$ are the nodes of the intersections at the first and the last point of the section $\bar{c}_k(\tau_1, \tau_2)$, respectively.

8. The computer-implemented method of claim 1, wherein the determining successors of the all sections comprises:
defining $S=1$ for $W_{min}$ checking or $S=-1$ for $D_{min}$ checking;
determining all pairs of connected sections $s=(\bar{c}k(\tau_1, \tau_2), n_1, n_2)$ and $s'=(\bar{c}_l(\tau'_1, \tau'_2), n'_1, n'_2)$ such that $n_2=n'_1$;
determining, for each pair of connected sections $(s, s')$:
the angle between curve tangents at a connecting node $n=n_2=n'_1$, where $\alpha(s,s',n)=\angle(T(r_k(t_L(\bar{c}_k(\tau_1,\tau_2)))), T(r_l(t_F(\bar{c}_l(\tau'_1,\tau'_2)))))$; and
signed curvatures of the curves at the connecting node $n=n_2=n'1$, where $\kappa(s,n)=S_\kappa(\bar{r}_k(t_L(\bar{c}_k(\tau_1, \tau_2))))$ and $\kappa(s', n)=S_\kappa(\bar{r}_l(t_F(\bar{c}_l(\tau'_1,\tau'_2))))$;
ignoring all pairs of connected sections $(s, s')$ for which $|\alpha(s, s', n)|=\pi$;
determining, for each node n, a pair of connected sections $(s_m, s'm)$ for which $S\alpha(s_m, s'_m, n)$ is minimum;
determining, from all such pairs for a given node n, the pair for which $\kappa(s_m, n)$ and $\kappa(s'_m, n)$ are minimum; and
defining $s'_m$ as a successor section of $s_m$, i.e. $s'_m=\sigma(s_m)$.

9. The computer-implemented method of claim 1, wherein the determining all violation boundaries formed by the all sections comprises:
creating a list $\Sigma$ of sections s for which a successor $\sigma(s)$ has been defined;
marking each section s from the list $\Sigma$ as not yet visited;
for each section s from the list $\Sigma$:
skipping s if it has already been visited;
creating a new boundary $\bar{b}$ and assigning $s' \leftarrow s$ if s has not already been visited;
adding s' to violation boundary $\bar{b}$ and marking s' as visited;
assigning $s' \leftarrow \sigma(s')$;
if $s' \neq s$, proceeding with adding s' to the violation boundary $\bar{b}$ and marking s' as visited; and
if $s'=s$, adding boundary $\bar{b}$ to resulting violation boundary set $\bar{\beta}$ and proceeding with skipping s if it has already been visited;
calculating area $A(\bar{b})$ of each violation boundary and retaining in the boundary set $\bar{\beta}$ only those with $A(\bar{b})<0$, when checking $W_{min}$ and $A(\bar{b})>0$, when checking $D_{min}$; and
adding curve section $c(\tau_1, \tau_2)$ to a set of violation curves for each curve section $\bar{c}(\tau_1, \tau_2)$ of each of the violation boundaries $\bar{b}$.

10. The computer-implemented method of claim 1, wherein the plurality of inputs comprises:
$C_{min}=-W_{min}<0$ when checking minimum width;
$C_{min}=D_{min}>0$ when checking minimum distance;
a number M of boundaries in input boundary set $\{b_m\}$;
an array $N[1, \ldots, M]$ of the numbers of curves $N[m]$ in each boundary $b_m$ from the input boundary set;
arrays $x[m=1, \ldots, M][1, \ldots, N[m]]$ and $y[m=1, \ldots, M][1, \ldots, N[m]]$ of symbolic expressions representing curve functions;
arrays $t_1[m=1, \ldots, M][1, \ldots, N[m]]$ and $t_2[m=1, \ldots, M][1, \ldots, N[m]]$ of parameter interval bounds;
an array $o[m=M][1, \ldots, M][1, \ldots, N[m]]$ of curve orientations with possible values $\pm 1$;
function CURVE-INTERSECTIONS(x, y, $t_1$, $t_2$, N, $\eta$, $\lambda$) to return a list of all intersections between the curves;
functions to obtain a numerical value of the symbolic expression e for parameter value t EVALUATE(e,t) and to get the symbolic expression representing the derivative of the symbolic expression e DERIVE(e); and minimum distance µ between the intersection points in the same node.

11. The computer-implemented method of claim 10, further comprising:
arguments for function CURVE-INTERSECTIONS(x, y, $t_1$, $t_2$, N, η, λ), the arguments comprising:
arrays of symbolic expressions x, y representing curve functions;
arrays of parameter interval bounds t2, t2;
the total number of curves N;
initial discretization tolerance ϵ;
reduction factor for the discretization tolerance η; and
precision λ by which the intersection points are determined; and
a resulting list of intersections with components intersection.curve1, inter section.curve2 representing array indices of the two intersecting curves, object.t1 and object.t2 representing corresponding parameter values on the two curves at the intersection, and object.point representing the intersection point.

12. A system, comprising:
a memory storing instructions; and
a processor configured to execute the instructions to cause the system to:
provide a plurality of inputs for an identified boundary set in a design for an integrated circuit, the plurality of inputs comprising a minimum width and a minimum distance between features in the integrated circuit, based on a manufacturing constraint;
determine a definition of distance for one of a minimum width checking and a minimum distance checking;
create a set of offset boundary curves from the identified boundary set;
determine a first intersection point formed between at least one pair of offset boundary curves;
transform the first intersection point into a design node;
determine a section between the first intersection point and a second intersection point for an offset boundary curve;
determine a violation boundary formed by the section based on the minimum width and the minimum distance; and
form a layout to manufacture a mask for fabricating the integrated circuit according to the identified boundary set when there are no violation boundaries formed by the section.

13. The system of claim 12, wherein to create the set of offset boundary curves, the processor executes instructions to:
create a set of offset boundary curves $\overline{b}'_m$ for each $b_m \in B$;
offset each curve $c_{mi}$;
add resulting offset curve $\overline{c}'_{mi}$ to $\overline{b}'_m$;
determine all pairs of boundary curves $c_{mi}$, $c_{mj}$ with j=i+1 or i=$N_m$ and j=1;
calculate an angle $\Delta\phi_{mij} = \mathcal{P} \angle (T(r_{mi}(t_{mi2}), T(r_{mj}(t_{mj1}))$;
create a vertex point $c_{mij}$ for each angle $\Delta\phi_{mij} > 0$ when D>0, or for each angle $\Delta\phi_{mij} < 0$ when D<0;
offset each vertex point $c_{mij}$; and
add resulting offset vertex point $\overline{c}'_{mij}$ to $\overline{b}'_m$.

14. The system of claim 12, wherein to determine all intersections between all pairs of offset boundary curves, the processor executes instructions to:
determine all intersections $\overline{r}_i(\tau) = \overline{r}_j(\tau')$ between all pairs of offset boundary curves $(\overline{c}'_i, \overline{c}'_j)$, where i, j=1, ..., N and i<j; and
denote each intersection point by I(i, τ, j, τ').

15. The system of claim 12, wherein to assign a node to each intersection point and to determine all sections between intersection points for each offset curve, the processor executes instructions to:
assign to each intersection point I(i, τ, j, τ') a node n(i, τ, j, τ') such that two intersection points within distance µ are assigned to a same node, where $|\overline{r}_i(\tau) - \overline{r}_k(\tau)| < \mu \Leftrightarrow n(i, \tau, j, \tau') = n(k, \overline{\tau}, 1, \overline{\tau}')$;
create a list of all intersection points I(i, τ, j, τ') with i=k;
sort the list by values of parameter τ in increasing order; and
create, for each adjacent pair of intersections (k,$\tau_1$, $j_1$, $\tau'_1$) and (k, $\tau_2$, $j_2$, $\tau'_2$) in the sorted list, a section ($\overline{c}_k(\tau_1, \tau_2)$, $n_1$, $n_2$), where $\overline{c}_k(\tau_1, \tau_2)$ is a section of curve $\overline{c}_k$ between parameter values τ1 and τ2 and n1=n(k,$t_F(\overline{c}_k(\tau_1, \tau_2))$, $j_1$, $\tau'_1$) and $n_2$=n(k,$t_L(\overline{c}_k(\tau_1, \tau_2))$, $j_2$, $\tau'_2$) are the nodes of the intersections at the first and the last point of the section $\overline{c}_k(\tau_1, \tau_2)$, respectively.

16. The system of claim 12, wherein, to determine successors of all sections, the processor executes instructions to:
define S=1 for $W_{min}$ checking or S=−1 for $D_{min}$ checking;
determine all pairs of connected sections s=($\overline{c}_k(\tau_1, \tau_2)$, $n_1$, $n_2$) and s'=($\overline{c}_i(\tau'_1, \tau'_2)$, $n'_1$, $n'_2$) such that $n_2 = n'_1$;
determine, for each pair of connected sections (s, s'):
the angle between curve tangents at a connecting node n=$n_2$=$n'_1$, where $\alpha(s,s',n) = \angle(T(\overline{r}_k(t_L(\overline{c}_k(\tau_1,\tau_2))))$, $T(\overline{r}_i(t_F(\overline{c}_i(\tau'_1,\tau'_2))))$; and
signed curvatures of the curves at the connecting node n=$n_2$=$n'_1$, where $\kappa(s,n)=S_\kappa(\overline{r}_k(t_L(\ddot{c}_k(\tau_1,\tau_2))))$ and $\kappa(s', n)=S_\kappa(\overline{r}_i(t_F(\ddot{c}_i(\tau'_1,\tau'_2))))$;
ignore all pairs of connected sections (s, s') for which |α(s, s', n)|=π;
determine, for each node n, a pair of connected sections ($s_m$, s'm) for which Sα($s_m$, s'm, n) is minimum;
determine, from all such pairs for a given node n, the pair for which κ($s_m$, n) and κ($s'_m$, n) are minimum; and
define $s'_m$ as a successor section of $s_m$, i.e. $s'_m = \sigma(s_m)$.

17. The system of claim 12, wherein to determine all violation boundaries formed by all sections, the processor executes instructions to:
create a list Σ of sections s for which a successor σ(s) has been defined;
mark each section s from the list Σ as not yet visited;
for each section s from the list Σ:
skip s if it has already been visited;
create a new boundary $\overline{b}$ and assigning s'←s ifs has not already been visited;
add s' to violation boundary $\overline{b}$ and marking s' as visited;
assign s'←σ(s');
if s'≠s, proceed with adding s' to the violation boundary $\overline{b}$ and marking s' as visited; and
if s'=s, add boundary $\overline{b}$ to resulting violation boundary set $\overline{\beta}$ and proceeding with skipping s if it has already been visited;
calculate area A($\overline{b}$) of each violation boundary and retaining in the boundary set $\overline{\beta}$ only those with A($\overline{b}$)<0, when checking $W_{min}$ and A($\overline{b}$)>0, when checking $D_{min}$; and
add curve section c($\tau_1$, $\tau_2$) to a set of violation curves for each curve section $\overline{c}(\tau_1, \tau_2)$ of each of the violation boundaries $\overline{b}$.

18. A non-transitory machine-readable storage medium comprising machine-readable instructions for causing a processor to execute a method, the method comprising:
providing a plurality of inputs for an identified boundary set in a design for an integrated circuit, the plurality of inputs comprising a minimum width and a minimum distance between features in the integrated circuit, based on a manufacturing constraint;

creating a set of offset boundary curves from the identified boundary set;

determining a first intersection point formed between at least one pair of offset boundary curves;

transform the first intersection point into a design node;

determining a section between the first intersection point and a second intersection point for an offset boundary curve;

determining a violation boundary formed by the section based on the minimum width and the minimum distance; and forming a layout to manufacture a mask for fabricating the integrated circuit according to the identified boundary set when there are no violation boundaries formed by the section.

19. The non-transitory machine-readable storage medium of claim 18, wherein the creating a set of offset boundary curves comprises creating a set of offset boundary curves $\overline{b}'_m$ for each $b_m \in B$ by:

offsetting each curve $c_{mi}$;

adding resulting offset curve $\overline{c}'_{mi}$ to $\overline{b}'_m$;

determining all pairs of boundary curves $c_{mi}$, $c_{mj}$ with $j=i+1$ or $i=N_m$ and $j=1$;

calculating an angle $\Delta\varphi_{mij} = \mathcal{P} \angle (T(r_{mi}(t_{mi2})), T(r_{mj}(t_{mj1})))$;

creating a vertex point $c_{mij}$ for each angle $\Delta\varphi_{mij}>0$ when $D>0$, or for each angle $\Delta\varphi_{mij}<0$ when $D<0$;

offsetting each vertex point $c_{mij}$; and adding resulting offset vertex point $\overline{c}'_{mij}$ to $\overline{b}'_m$.

20. The non-transitory machine-readable storage medium of claim 18, wherein determining all violation boundaries formed by sections comprises:

creating a list $\Sigma$ of sections s for which a successor $\sigma(s)$ has been defined;

marking each section s from the list $\Sigma$ as not yet visited;

for each section s from the list $\Sigma$:

skipping s if it has already been visited;

creating a new boundary $\overline{b}$ and assigning $s' \leftarrow s$ if s has not already been visited;

adding s' to violation boundary $\overline{b}$ and marking s' as visited;

assigning $s' \leftarrow \sigma(s')$;

if $s' \neq s$, proceeding with adding s' to the violation boundary $\overline{b}$ and marking s' as visited; and if $s'=s$, adding boundary $\overline{b}$ to resulting violation boundary set $\overline{\beta}$ and proceeding with skipping s if it has already been visited;

calculating area $A(\overline{b})$ of each violation boundary and retaining in the boundary set $\overline{\beta}$ only those with $A(\overline{b})<0$, when checking $W_{min}$ and $A(\overline{b})>0$, when checking $D_{min}$; and adding curve section $c(\tau_1, \tau_2)$ to a set of violation curves for each curve section $\overline{c}(\tau_1, \tau_2)$ of each of the violation boundaries $\overline{b}$.

* * * * *